(12) United States Patent
Obara et al.

(10) Patent No.: US 6,741,941 B2
(45) Date of Patent: May 25, 2004

(54) METHOD AND APPARATUS FOR ANALYZING DEFECT INFORMATION

(75) Inventors: Kenji Obara, Ebina (JP); Yuji Takagi, Kamakura (JP); Hisae Shibuya, Chigasaki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/449,528

(22) Filed: May 29, 2003

(65) Prior Publication Data

US 2004/0044484 A1 Mar. 4, 2004

(30) Foreign Application Priority Data

Sep. 4, 2002 (JP) .......................... 2002-258386

(51) Int. Cl.[7] .............................................. G06F 19/00
(52) U.S. Cl. ......................... 702/35; 702/81; 702/182; 702/183; 700/110; 700/121
(58) Field of Search ............................... 702/35, 81–84, 702/182–183, 186–187; 700/108–110, 121; 382/144–145, 149; 356/237.1, 237.2, 237.4, 237.5

(56) References Cited

U.S. PATENT DOCUMENTS 5,801,965 A * 9/1998 Takagi et al. .................. 702/35
6,438,438 B1 * 8/2002 Takagi et al. ............... 700/121

FOREIGN PATENT DOCUMENTS

| JP | 63-108253 | 5/1988 |
| JP | 07-201946 | 8/1995 |
| JP | 08-124982 | 5/1996 |
| JP | 2000-222033 | 8/2000 |

OTHER PUBLICATIONS

Hisae Shibuya, et al., "Spatial Pattern Recognition of Defect Point Distribution," *Sixth Intelligent Mechatronics Workshop* (Aug. 30–31, 2001), pp. 279–284.
Kaoru Nakano, "Associative Memory Model and Intelligent Information Processing," *Association*, 1st ed., Shokodo Co., Ltd. (reprinted Oct. 30, 1979), title page, partial table of contents, pp. 11–21, 106–107.

* cited by examiner

*Primary Examiner*—Bryan Bui
(74) *Attorney, Agent, or Firm*—Townsend and Townsend and Crew LLP

(57) ABSTRACT

To efficiently extract identification of apparatuses causing problems in a thin-film device manufacturing process, candidates for the problem-generating manufacturing apparatus are extracted by evaluating data obtained in relation to produced inspections and data indicating the states of the manufacturing apparatus, with respect to products that enable efficient extraction of problem-generated apparatuses in a thin-film devise manufacturing process. This facilitates inferring the identification of the problem-generating apparatus.

28 Claims, 23 Drawing Sheets

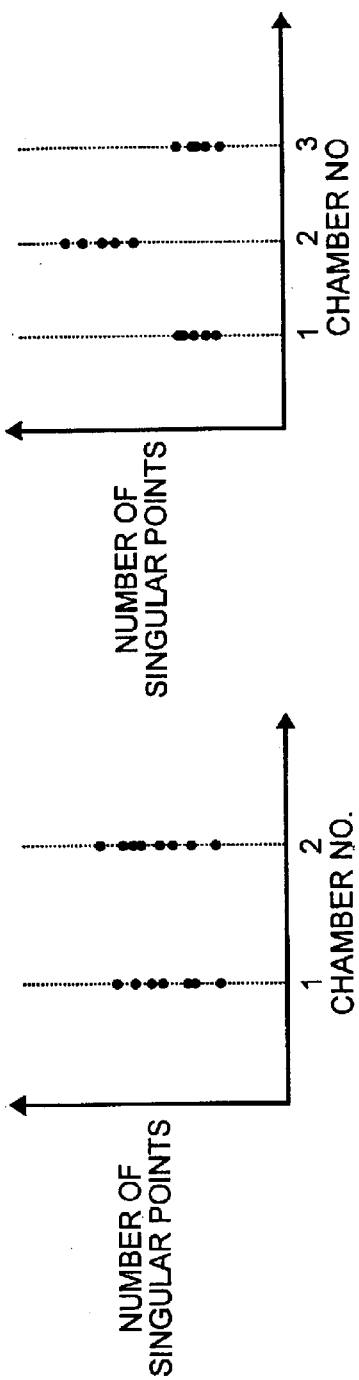

FIG.17

WAFER INFORMATION

- TYPE OF PRODUCT: C3A111 ▼
- LOT NO.: TNC2022 ▼
- WAFER NO.: 05 ▼ | LIST
- PROCESS: METAL SPUTTERING THROUGH WIRING 1 RESIST REMOVAL ▼

INSPECTION AND ANALYSIS INFORMATION

MAP | IMAGE INFORMATION | COMPOSITION INFORMATION

32% / 68%  Si, O / W

NUMBER OF DETECTIONS: 239

APPARATUS HISTORY

| PROCESS | APPARATUS NO. 1 2 3 4 |
|---|---|
| SPUTTERING | |
| [RESIST] APPLICATION | |
| EXPOSURE | |
| ETCHING | |
| WASHING | |

APPARATUS INFORMATION

MAPS | IMAGES | PROCESSING LOG

EXTRANEOUS MATTER AND DEFECT DENSITY — NUMBER/cm²

- SPUTTERING 3 ▼ / CHAMBER 1 ▼ — 4/1, 4/8, 4/15
- APPLICATION 1 ▼ — 4/8, 4/15, 4/22
- EXPOSURE 2 ▼ — 4/8, 4/15, 4/22
- ETCHER 1 ▼ / CHAMBER 1 ▼ — 4/15, 4/22, 4/29
- WASHING 1 ▼ — 4/15

TIME / PROCESSING DATE

FIG.18

WAFER INFORMATION (1602, 1604)

- TYPE OF PRODUCT: C3A111 ▼
- LOT NO.: TNC2022 ▼
- WAFER NO.: — ▼ LIST ▼
- PROCESS: METAL SPUTTERING THROUGH WIRING 1 RESIST REMOVAL ▼

INSPECTION AND ANALYSIS INFORMATION

SPUTTERER 3
CHAMBER NO. DENSITY ▼

[graph: 1 5 10 15 20 25 — WAFER ▼] (1605)

APPARATUS HISTORY (1606)

| PROCESS | APPARATUS NO. | | | |
|---|---|---|---|---|
| | 1 | 2 | 3 | 4 |
| SPUTTERING | ▥ | □ | ▨ | □ |
| [RESIST] APPLICATION | □ | ■ | □ | □ |
| EXPOSURE | □ | □ | □ | □ |
| ETCHING | ▥ | □ | ▨ | □ |
| WASHING | ■ | □ | ■ | □ |

APPARATUS INFORMATION (1601, 1603)

MAPS | IMAGES | PROCESSING LOG

EXTRANEOUS MATTER AND DEFECT DENSITY
NUMBER/cm²

- SPUTTERING 3 ▼ / CHAMBER 1 ▼ — [graph 4/1 – 4/8 – 4/15]
- APPLICATION 1 ▼ — [graph 4/8 – 4/15 – 4/22]
- EXPOSURE 2 ▼ — [graph 4/8 – 4/15 – 4/22] (1607)
- ETCHER 1 ▼ / CHAMBER 1 ▼ — [graph 4/15 – 4/22 – 4/29]
- WASHING 1 ▼ — [graph TIME / PROCESSING DATE]

WAFER INFORMATION — 1602

- TYPE OF PRODUCT: C3A111 ▼
- LOT NO.: TNC2022 ▼
- WAFER NO.: 05 ▼   LIST ▼
- PROCESS: METAL SPUTTERING THROUGH WIRING 1 RESIST REMOVAL

1604

INSPECTION AND ANALYSIS INFORMATION

MAP    IMAGE INFORMATION    COMPOSITION INFORMATION

Si,O     W

32%    68%

NUMBER OF DETECTIONS: 239

1605

APPARATUS HISTORY

| PROCESS | APPARATUS NO. 1 | 2 | 3 | 4 |
|---|---|---|---|---|
| SPUTTERING | | | | |
| [RESIST] APPLICATION | | | | |
| EXPOSURE | | | | |
| ETCHING | | | | |
| WASHING | | | | |

1606

APPARATUS INFORMATION — 1603

EXTRANEOUS MATTER AND DEFECT DENSITY    MAPS | IMAGES | PROCESSING LOG

▲ PARTS REPLACEMENT    ● DISASSEMBLY AND CLEANING

1601

- SPUTTERING 3 ▼ / CHAMBER 1 ▼ — 4/1, 4/8, 4/15
- APPLICATION 1 ▼ — 4/8, 4/15, 4/22
- EXPOSURE 2 ▼ — 4/8, 4/15, 4/22 — 1607
- ETCHER 1 ▼ / CHAMBER 1 ▼ — 4/15, 4/22, 4/29
- WASHING 1 ▼ — 4/15

TIME    PROCESSING DATE

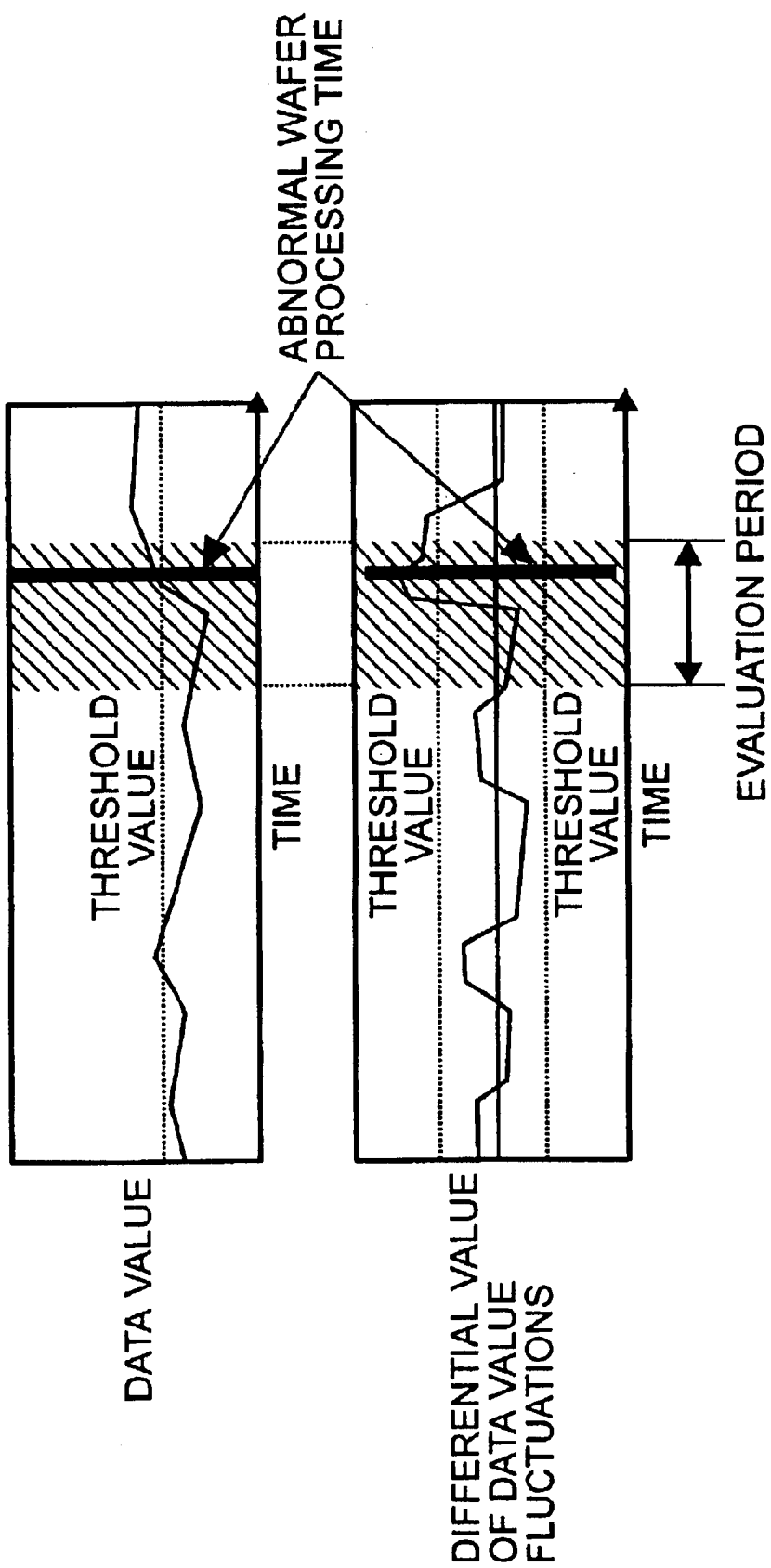

METHOD AND APPARATUS FOR ANALYZING DEFECT INFORMATION

BACKGROUND OF THE INVENTION

1. Field of the Invention

The invention relates to a method for specifying defective processes and apparatus in a thin-film device manufacturing process on the basis of inspection information.

2. Description of the Related Art

The manufacture of thin-film devices, such as semiconductors, liquid crystal displays, and hard disk magnetic heads constitutes numerous of processes.

The number of procedures for such processing at times reaches several hundred. When an exterior abnormality, such as extraneous matter or broken wiring, occurs on a thin-film device due to a defect or an abnormality in the manufacturing conditions of the processing apparatus, the probability of defects occurring in a product increases, and yields decrease. Accordingly, specifying the apparatus that generated the problem and taking corrective measures is important for maintaining and enhancing yields. Therefore, inspections, such as extraneous matter inspections and external appearance inspections are carried out for each main process, and monitoring is performed to determine if processing is being carried out properly. Because time and labor constraints currently make it impossible to carry out inspections of all the substrates being processed in each processing procedure, ordinarily, inspections are performed on samples of processed substrates taken by lot unit, or processed substrate unit, or a combination thereof, for each of a number of sequential processes. The term processed substrate signifies the minimum unit for which product processing is being carried out, and if it is a semiconductor, indicates one wafer.

When extraneous matter and external appearance abnormalities occur frequently, an in-depth analysis for specifying the apparatus generating the abnormality is carried out for the individual substrate in question. For example, a detailed observation of the location provided by an inspection apparatus is carried out, and the process generating the abnormality is inferred by observing the shape of the extraneous matter or its appearance. Further, either a cross section, which intersects one part of an extraneous matter or abnormality, is created, and the layer in which the abnormality occurred is determined, or a spectrum related to an element or element information comprising extraneous matter or a defect is obtained by an appropriate technique, such as EPMA (Electron Probe Micro Analysis), AES (Auger Electron Spectroscopy), micro-Raman spectroscopy or microfluorescence spectroscopy. Analysis is performed thereon; the substance constituting the extraneous matter or defect is specified, and the manufacturing process in which the abnormality most likely occurred is inferred. Then, appropriate countermeasures are taken, e.g. by carrying out maintenance or cleaning. The term "singular point" refers to a point provided as the location where an abnormality was detected. Herein, extraneous matter, an external appearance abnormality or other problem are referred to as a "defect."

Inferring the process in which an abnormality occurred from external appearance requires the advanced judgment of an analyst, and the individual differences and the time required for a determination are problems. A procedure for automatically classifying defects according to specific rules is disclosed in Japanese Patent Application Laid-Open No. 7-201946.

Further, the problem with specifying the name of a substance according to the spectrum is that it depends to a large extent on the judgment of an analyst, similar to a determination based on external appearance information. It also takes time, and can involve differences of opinion. Procedures for automatically specifying the name of a substance from spectral data are disclosed in Japanese Patent Application Laid-Open No. 63-108253 and Japanese Patent Application Laid-Open No. 8-124982. Further, a procedure for specifying a problem processing apparatus from the correlation between a database related to defects generated by a processing apparatus and data related to a defect acquired by an inspection apparatus is disclosed in Japanese Patent Application Laid-Open No. 2000-222033.

To quickly and accurately specify a processing apparatus that is causing a problem, it is necessary to carry out analysis multiple tests, such as pattern generation of extraneous matter/defects, external appearance, element information, processing history, and the processing log for each processing apparatus. If a processing apparatus includes a plurality of processing units (subsequently described as chambers) for doing the same processing, the processing log for each chamber must be checked.

The fact that a multiple sources of information are used is not mentioned in the conventional procedure for automatically classifying defects by external appearance or the procedure for automatically specifying the name of a substance from spectral data. Further, in the procedure for specifying a processing apparatus, no mention is made of striving to make the procedure more efficient by limiting the time period and apparatus targeted for searching.

BRIEF SUMMARY OF THE INVENTION

The invention provides a method and apparatus for enabling an apparatus that is causing a problem to be quickly specified from product inspection information, in which an abnormality was detected. It also provides a method for analyzing defect information obtained by inspecting work pieces in a thin-film device manufacturing process. The method is constituted such that defects occurring on substrates as a result of carrying out processing are extracted by comparing data obtained by inspecting the processed substrates prior to carrying out processing. This can involve plural processing apparatuses in a thin-film device manufacturing process, and data obtained by inspecting the processed substrates. When the number of extracted defects is greater than a pre-established number, in-depth analysis of the defects is carried out, and the in-depth analysis information, information indicating the processing histories of the processed substrates, and information related to the state of the processing apparatus, are displayed on a screen.

Further, the invention is constituted such that the apparatus causing the problem is extracted by evaluating via computer the correlation between the in-depth analysis information, the processing-history-derived information, and the processing apparatus status-related information. These and other objects, features and advantages of the invention will be apparent from the following detailed description of preferred embodiments of the invention, as illustrated in the accompanying drawings.

BRIEF DESCRIPTION OF THE DRAWINGS

FIG. 13 through FIG. 16 are diagrams showing an embodiment of a data analysis results display method of the invention;

FIG. 17 through FIG. 22 are diagrams showing data analysis results display screens of the invention;

FIG. 28 through FIG. 30 are illustrations showing an embodiment of a data analysis method of the invention.

DETAILED DESCRIPTION OF THE INVENTION

Figure 1:
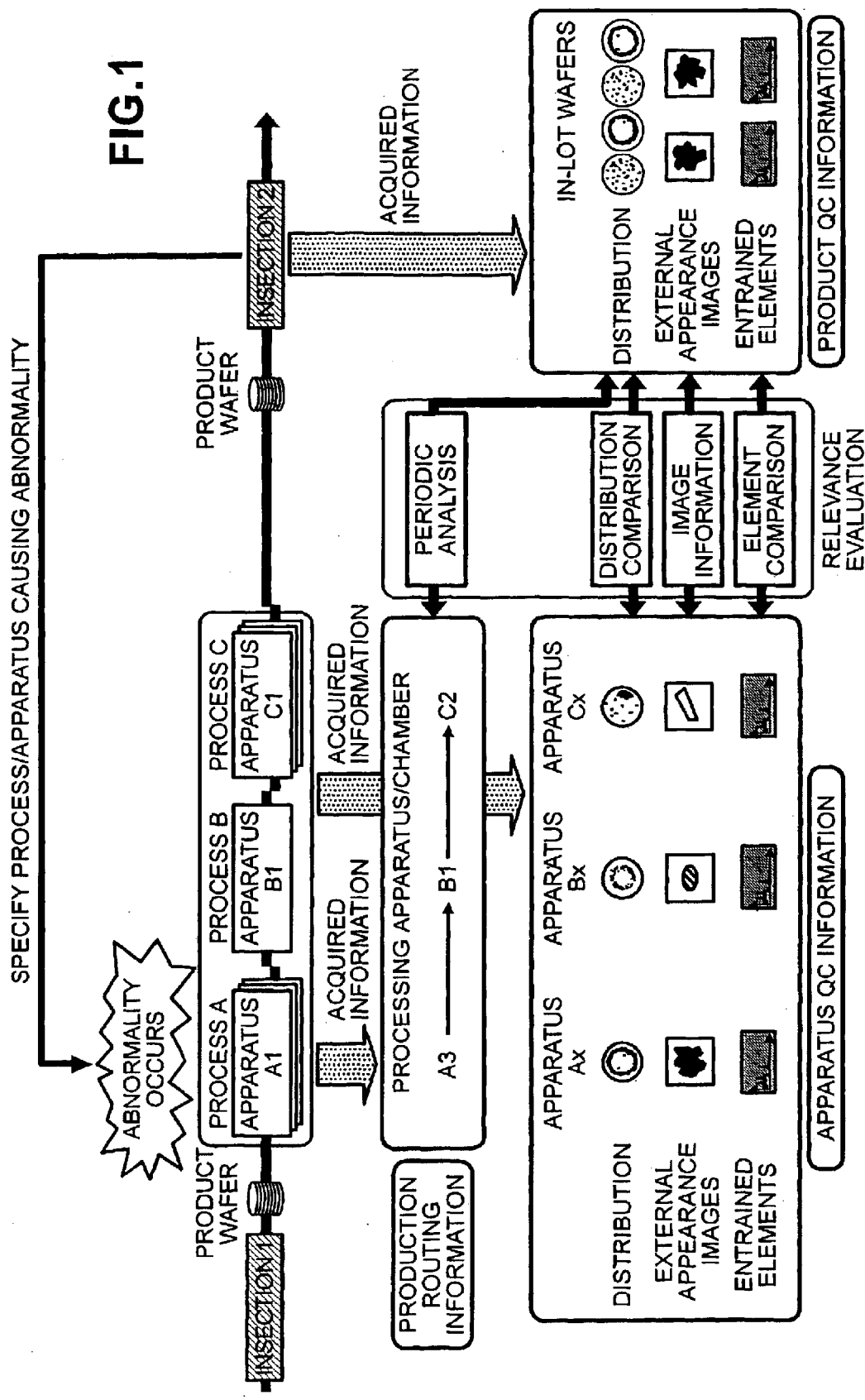
FIG. 1 is a diagram showing a concept of the invention.

The embodiments of the invention will be explained below using semiconductors as examples. The concept of the invention is shown in FIG. 1. As explained above, inspections are implemented in each of a number of sequential processes, and FIG. 1 begins by showing the processes between inspection 1 and inspection 2. In inspection 1 and inspection 2, location information of respectively detected defects is obtained, and the location information of the net defects, which occurred in the processing procedures A, B, C shown in the figure, can be obtained by subtracting from defect location information obtained in inspection 1 those defects detected in the same locations in inspection 2. The invention targets these net defects.

In inspection 2, defect information from inspection of a product wafer is acquired. Examples of this information are is defect distribution, external appearance, element information, and so forth. Defect distribution information can be obtained from the defect location information provided from the inspection apparatus. External appearance images are obtained by using review apparatus, such as an optical microscope or an electron microscope to observe and acquire defect images of locations corresponding to the defect location information of the inspection apparatus. Entrained element information is obtained by carrying out EPMA or other element analysis for defects recognized in locations corresponding to the defect location information. Such defect information obtained from to inspections of product wafers will subsequently be referred to as "product QC (Quality Control) information."

Meanwhile, information is acquired regarding which apparatus processed a product wafer in each procedure. Here, the processing apparatus of each procedure is not limited to one unit, but rather a plurality of units can exist, and a plurality of chambers can exist in each apparatus, but in that case, the chamber, which is the smallest processing unit of a processing apparatus, which is specified. This will subsequently be referred to as "production routing information." FIG. 1 shows an example in which processing is done by three apparatuses of Process A, one apparatus of Process B, and two apparatuses of Process C.

Further, information related to defects (extraneous matter) caused by processing apparatus is acquired for each apparatus and chamber unit. This is obtained, for example, by preparing a wafer, which is processed only by an apparatus targeted for information acquisition, by extracting a dummy wafer, which is not subjected to patterning or other such processing subsequent to its being processed in the apparatus or chamber targeted for information acquisition, and by acquiring the same information when product QC information is obtained for this wafer. This information is obtained independently of product wafer information and is acquired and stored in accordance with predetermined rules. This information is referred to as "apparatus QC information." A candidate for an apparatus or chamber that is causing problems is extracted, for example, by evaluating the correlation between production routing information and apparatus QC information relative to product QC information.

One correlation evaluation method is periodic defect distribution analysis of product QC information. For example, when the defect distribution of the respective wafers in a lot is characteristic for every other wafer, a determination can be made that there is a high correlation to an apparatus in which every other wafer was processed by the same chamber, that is, an apparatus having two chambers. Further, as another example of an evaluation method, there is the collating of apparatus QC information against product QC information with regard to defect distribution, defect appearance, or entrained elements. A determination can be made that there is a high likelihood that the problem was caused by an apparatus that has recognizable similarities. As information for comparison with product QC information, information on the timing and contents of maintenance, such as apparatus parts replacement and cleaning, can be combined with processing log information regarding when a product wafer that is being observed was processed.

Figure 2:
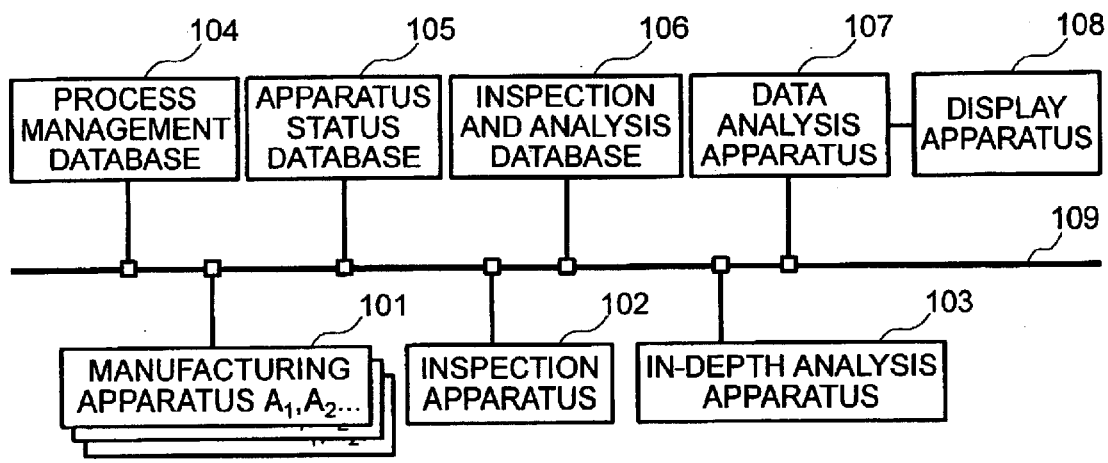
FIG. 2 is a diagram showing an example of the structure of the invention.

FIG. 2 is a diagram showing a first embodiment of an apparatus configuration of the invention. Reference numeral 1 is manufacturing apparatus, such as film formation apparatus, exposure apparatus, and etching apparatus; 2 is inspection apparatus, such as extraneous matter inspection apparatus and external appearance inspection apparatus; 3 is in-depth analysis apparatus for acquiring detailed information, such as optical review apparatus for acquiring images of relevant coordinate neighborhoods based on defect detection information from an inspection apparatus, SEM (Scanning Electron-Microscope) or other such image capturing apparatus, and EPMA, AES or other such analysis apparatus for analyzing element information; 4 is a process management database for holding production routing information, such as what lots were processed in which chambers of which processing apparatus and when; 5 is an apparatus status database for storing the production logs of the respective manufacturing apparatus, maintenance information, and apparatus QC information; 6 is an inspection and analysis database for storing product QC information, which is the results of product wafer inspections and the results of in-depth analyses; 7 is data analysis apparatus for carrying out analyses and evaluations as to whether or not inspection information from inspection apparatus falls into the normal range, and which apparatus is most likely to be causing a problem; 8 is a display apparatus for displaying analysis results and the like; and 9 is a network. The apparatuses indicated by 1 through 7 are capable of sending and receiving data via network 9.

In process management database 4, there is stored data, which, when a product is processed by a certain processing apparatus, makes it possible to specify the lot number thereof, each wafer number, the processing apparatus by which the product was processed, and when there is a plurality of chambers, either the chamber in which the product was processed, or the time it was processed. In apparatus status database 5, a log of processing conditions acquired for each processing apparatus, data related to defects generated by each apparatus, and data calculated by processing the data are stored chronologically, and these logs and data are either added to or updated each time new data is acquired.

A product wafer is inspected by inspection apparatus 2, and, in accordance with those results, defect images or element information thereof is acquired by in-depth analysis apparatus 3. The acquired data is sent to inspection and analysis database 6. Data analysis apparatus 7 communicates with the various databases 4, 5, and 6 connected to the network, determines whether or not this information is in the normal range, and analyzes and evaluates apparatuses that are likely to be causing a problem. Determination results and analysis results are displayed on display apparatus 8.

The data content of each database is explained next. The contents of process management database 4 are explained first. Production routing information is recorded in process management database 4. Production routing information is explained with reference to FIG. 3.

Figure 3:
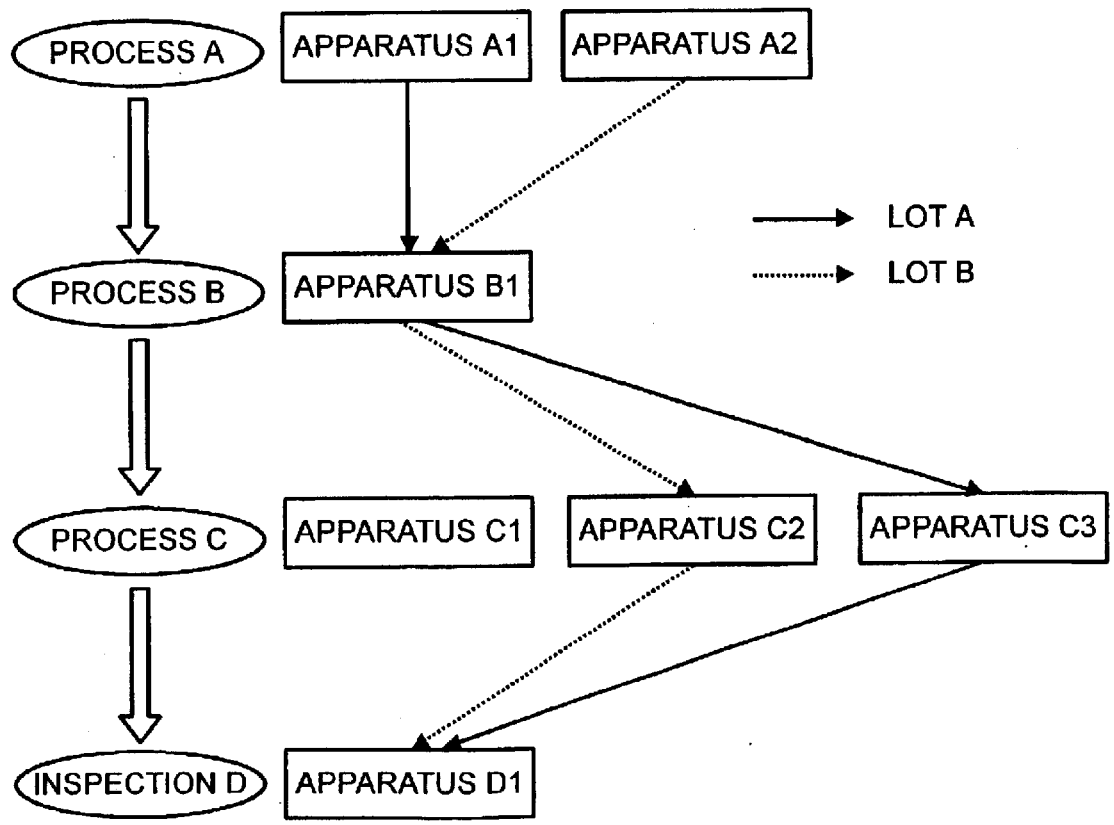
FIG. 3 is a diagram showing an example of production routing information used in the invention.

As described above, a semiconductor is manufactured by a plurality of processes. FIG. 3 shows an exemplary of a case in which there are three processes, A, B, and C, and inspection D is carried out thereafter. Process A has two processing apparatuses, and Process C has three processing apparatuses. In each process, a wafer is processed by a processing apparatus. Here, in most cases, a plurality of units of processing apparatuses are used in parallel in processes that done singly would take extensive time to complete, to enhance throughput, the time required for manufacturing. In such cases, even though a product is in a lot that underwent the same processing procedure, the apparatus in which it was actually processed is not necessarily the same.

Figure 4:
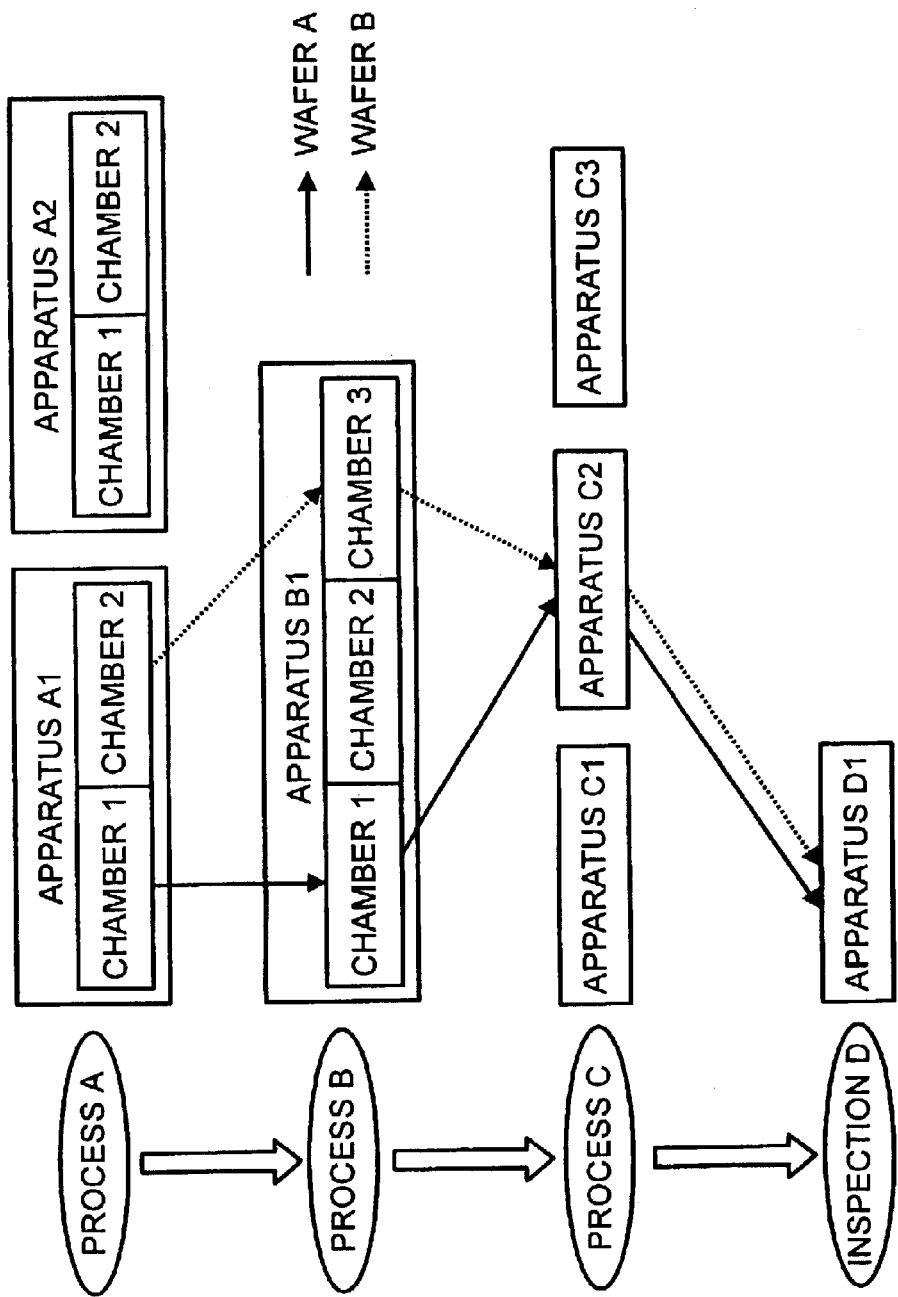
FIG. 4 is a diagram showing another example of production routing information used in the invention.

For example, in FIG. 3, the history of the apparatus that processed Lot A is indicated by the solid line arrow, and the history of the apparatus that processed Lot B is indicated by the dotted line arrow. At this time, the historical information indicating which manufacturing apparatus processed a certain wafer in each processing procedure is apparatus routing information. Further, when a plurality of processing units, such as chambers, exist in a manufacturing apparatus, apparatus routing information is composed of the chamber information. In this case, since there are times when the processing chamber differs by wafer even within the same lot, as with Wafer A and Wafer B shown in FIG. 4, apparatus routing information also differs for each wafer.

Production routing information, more specifically, product codes that make it possible to specify the minimum unit of a product being processed in an apparatus, such as lot codes and wafer codes, is recorded. These codes can be kept in the same column for each minimum unit, or can be stored hierarchically as long as it is possible to specify a processing history for each minimum unit. A name or code that specifies the apparatus that processed each of the units is linked to the product code and recorded together with the product code. When there is a plurality of apparatuses carrying out the same processing, a name or code is determined to specify which apparatus processed the subject product.

The processing apparatus herein refers to an apparatus that is likely to cause a change in the state of a wafer before and after it passes through this apparatus, and can be a cleaning apparatus, wafer sorter, wafer inspection apparatus, or wafer handling apparatus. Further, when a processing apparatus has a processing region capable of parallel processing a minimum product unit, such as having a plurality of chambers, a name or code is recorded to specify this processing region. In addition, the loading time, unloading time, or both, for this processing apparatus is recorded in this database.

The contents of apparatus status database 5 are explained next. Apparatus QC information for each processing apparatus, and information related to the processing state or the maintenance state are stored in apparatus status database 5. Apparatus QC information refers, for example, to the number of defects, defect coordinates, defect distribution in a wafer, images of the external appearance of defects, defect element information, attribute information for each defect provided in accordance with the defect's external appearance or distribution state, and numerical values calculated from the data, such as the ratio of the number of defects for each attribute. The number of defects, coordinates of defects, and distribution of defects in a wafer are obtained as the output of an inspection apparatus. However, these include the possibility of false information (information provided as a singular point, but for which a defect was not found during a review).

An image of the external appearance of a defect is to an image acquired by an optical microscope, SEM or other imaging apparatus of the vicinity of a location corresponding to the defect coordinates. Defect element information is data obtained by an EPMA, AES or other such element information analysis apparatus having as a target a defect confirmed by an optical review apparatus or SEM. The recording format can be element information spectral data, waveform images, or a representative element name, as long as it is data that expresses the characteristics of defect element information.

Attribute information provided in accordance with external appearance refers, for example, to a classification code automatically appended by the procedures disclosed in patent (JP-A 7-201946), or a classification code manually appended by an operator. By providing "false information" in a classification code, and ignoring defects appended with this classification code, it is possible to eliminate the effects of "false information," for defects that do not exist from the number of defects, defect coordinates, and distribution of defects in a wafer.

Attribute information provided in accordance with the state of distribution indicates distribution density. This attribute information is calculated using the method for identifying the shape of a point group distribution disclosed in Hisae Shibuya et al., "Spatial Pattern Recognition of Defect Point Distribution," Sixth Intelligent Mechatronics Workshop, pp. 279 and 280 (Aug. 30–31, 2001), and a certain point group is either densely or sparsely distributed. When the point group is densely distributed, the attribute information can also include information about what kind of pattern the shape of the closely clustered part resembles. A pattern refers, for example, to a form that expresses a concentric-circle-shaped distribution, or a linear-shaped distribution, or a distribution of the orientation flat or notched side, or the shape or distribution location thereof, or both. Further, the generation ratio for each of the classifications can also be recorded.

Information on the processing state refers to processing log information in which a log of the various processing conditions during processing is recorded, to information on the degree of divergence from the set values of processing conditions, or to both. For example, for etching apparatus, the log of processing conditions is chronological information of the temperature, pressure, gas flow, applied high-frequency power and so forth inside a chamber. Information on the maximum value, average value, median value and other such statistical values of the divergence from set values in these series of processes can be recorded as representative values.

Information on the maintenance state is information on maintenance time, such as the replacement time for parts of a processing apparatus, and disassembly and cleaning times. For this data to be used for each processing apparatus, a product wafer can be inspected by inspection apparatus 2 prior to being loaded into processing apparatus, and can be inspected once again by inspection apparatus 2 subsequent to being processed by manufacturing apparatus 1, the detected singular point coordinates can be compared, and only that data determined to have been generated anew can be targeted for recording. This information is continuously acquired in accordance with certain prescribed rules, and is sequentially either added or updated.

The contents of inspection and analysis database 6 are explained next. Inspection and analysis data for a product wafer is recorded in inspection and analysis database 6. Data items may include the number of singular points detected by an inspection apparatus, coordinates of singular points, distribution of singular points in a wafer, defect images, defect element information, attribute information for each defect provided in accordance with the external appearance or distribution status of defects, and numerical values calculated from the data, such as the ratio of the number of defects for each attribute, which were described in the explanation of database 5.

Figure 5:
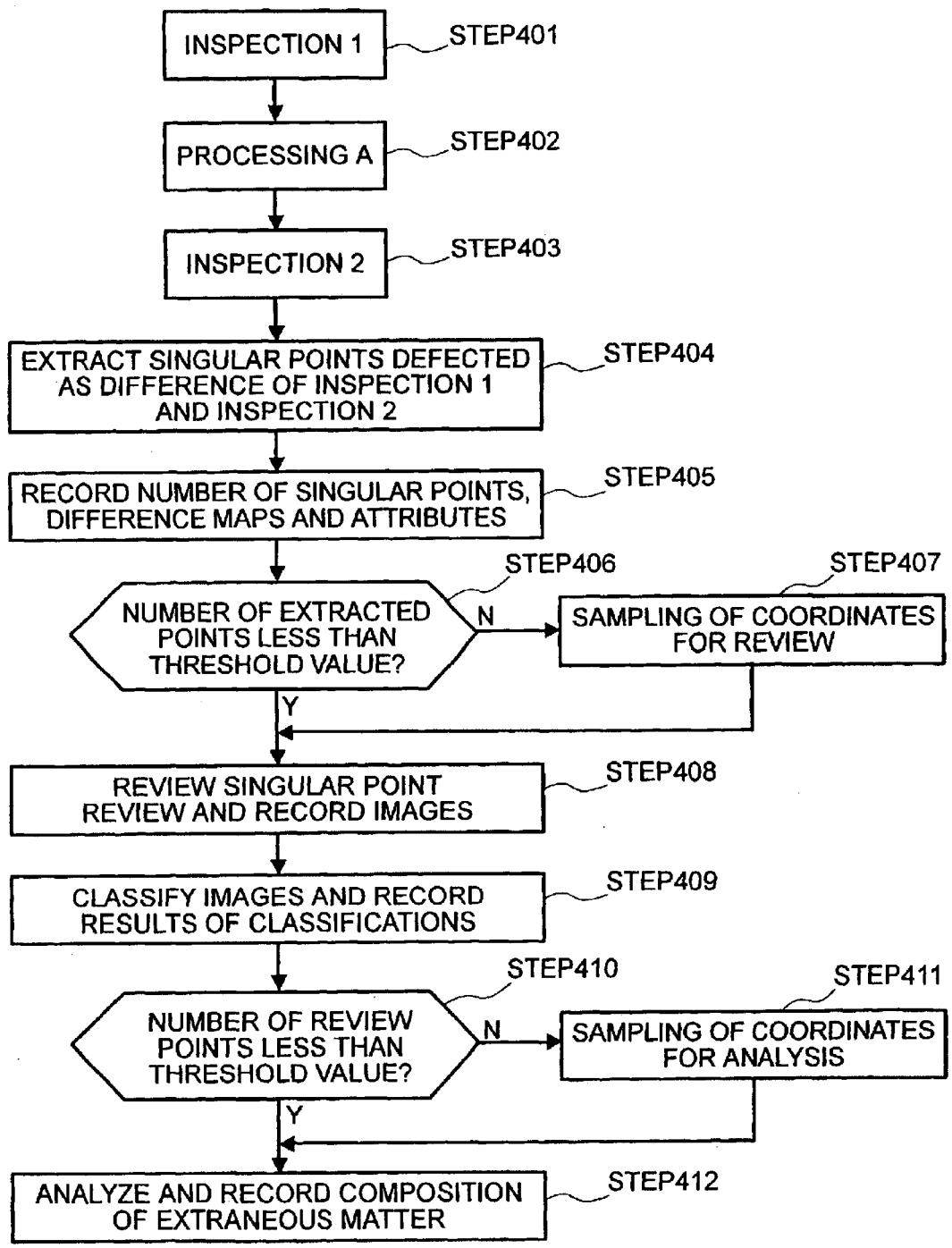
FIG. 5 is a flowchart showing an embodiment of a method for acquiring data for recording in a database of the invention.

Next, the procedure for acquiring data stored in apparatus status database 5 is explained. FIG. 5 is a flowchart showing an acquisition procedure. Data targeted at certain Processing A will be explained. First, in Step 401, a defect inspection 1 is implemented prior to processing a wafer in a manufacturing apparatus carrying out Processing A. In Step 402, Processing A is carried out. Next, in Step 403 inspection 2 is implemented. Here, it is desirable that defect detection sensitivity be set so as to be the same for inspection 1 of Step 401 and inspection 2 of Step 403.

In Step 404, defects that were provided anew in inspection 2 of Step 403 without being provided in inspection 1 of Step 401 are extracted as net defects. This can be achieved, for example, by computing the distance of the defect coordinates provided in inspection 1 of Step 401 relative to each of the defect coordinates provided in inspection 2 of Step 403. If the minimum value of a calculated distance is less than a certain threshold value, the defect is ignored as a commonly provided defect, and only defects of calculated distances that are greater than the threshold value are extracted. The method for extracting net defects is not limited to the above, and information on defects generated anew by carrying out processing with processing apparatus A can also be extracted. In Step 405, the ID numbers of defects extracted in Step 404 are transmitted to database 5. The attribute information provided in accordance with the distribution status can be transmitted at this time to apparatus status database 5.

Next, in Step 406, it is determined whether or not the number of extracted defects is less than a previously set threshold value. If the number of points of defects is greater than the threshold value, then, in Step 407, a sampling of coordinate points is taken in accordance with a predetermined sampling rule. The sampling rule states, for example, that only a certain established number can be randomly extracted, and that a fixed number can be extracted from densely distributed defects and sparsely distributed defects, respectively, based on the attribute information provided in accordance with the state of distribution. Further, the number of sampling points can be stipulated in proportion to the number of detected points. In Step 407, it is better if the number of coordinate points subsequent to sampling is smaller than a predetermined threshold value, but this sampling rule is not limited to the above.

Next, in Step 408, a review, which is one of the in-depth analyses, is carried out and recorded in apparatus status database 5. This review can be achieved using a Hitachi Limited-manufactured I-890 or other such inspection apparatus comprising optical review functions, or a Hitachi Limited-manufactured RS-3000 or other such review SEM. The review, based on coordinates provided from an inspection apparatus, acquires images of the vicinity of these coordinate points, but the review is not limited to this function.

In Step 409, the obtained images are classified. The results of this classification can be recorded in apparatus status database 5. A classification can be done manually by an operator, or can be done automatically using the method according to patent literature 1.

Next, in Step 410, it is determined whether or not the number of defects reviewed is less than a pre-set threshold value. If the number of review points is greater than the threshold value, then, in Step 411, a sampling of coordinate points is taken in accordance with a predetermined rule. The sampling method can be the same as that in Step 407, or a different method can be used. Next, in Step 412, data related to element information is acquired using an in-depth analysis apparatus 3 capable of acquiring element information, such as EPMA and AES, relative to defects ascertained by the review, and this data is transmitted to apparatus status database 5.

Here, a rule that prohibits increases without an upper limit corresponding to the number of defects, can be established for determining whether a target sampling is required in the steps subsequent to Step 406 and Step 407, but this determination is not limited to the method described in the embodiment.

It is desirable that apparatus status database 5 store data for each individual processing apparatus, but this data can be recorded and managed as data of processing blocks comprising a plurality of processing apparatuses. This is because, if it is possible to specify the processing block that constitutes a problem, it becomes easier to narrow down problem apparatus candidates, making it possible to better specify the problem apparatus.

The information stored in apparatus status database 5 can be gathered using a dummy wafer, or the data can be gathered by applying the procedure shown in FIG. 5 for a product wafer at a certain specified frequency. The frequency of data storage in apparatus status database 5 can be arbitrarily set by a user, but the criteria for this can be based on time or on the number of wafers processed in an apparatus or a chamber.

Figure 6:
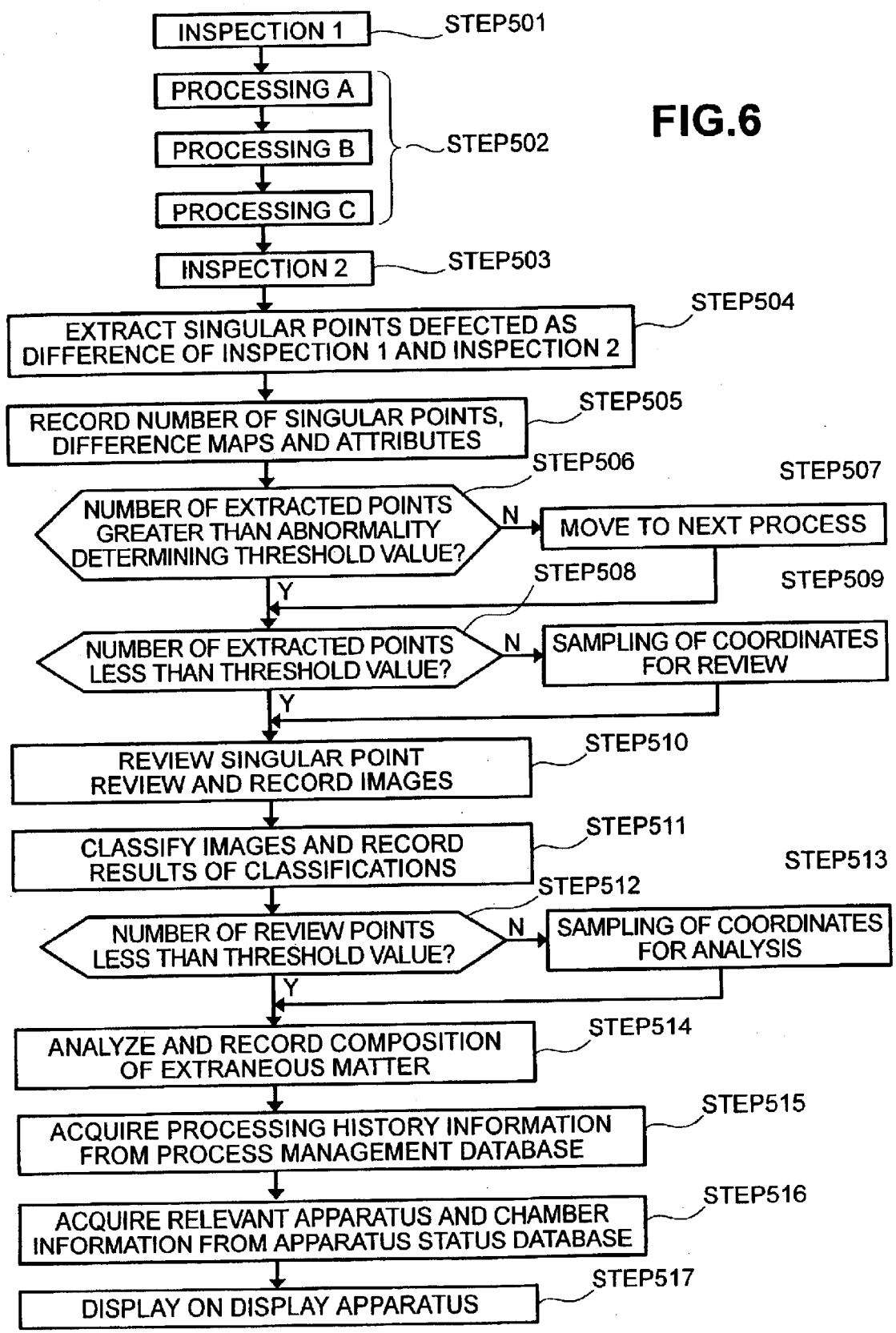
FIG. 6 is a flowchart showing an embodiment of an application procedure of the invention.

Next, a procedure for applying the first embodiment to a product wafer is explained. FIG. 6 is a flowchart showing an application procedure. As explained above, ordinarily, an inspection is carried out in each of a certain number of processes in a manufacturing process. In Step 501, a defect inspection 1 is implemented subsequent to a processing procedure not shown in the figure, which was carried out prior to Step 501. In Step 502, a series of processing is performed. The figure shows an example in which a product wafer passes through three processing apparatuses, but the number of processing procedures in this step is not limited to three. In Step 503, inspection 2 is implemented. It is desirable that the defect detection sensitivity be set so as to be the same for inspection 1 of Step 501 and inspection 2 of Step 503.

Next, in Step 504, defects that were provided anew in inspection 2 of Step 503 without being provided in inspection 1 of Step 501 are extracted as net defects. This can be achieved, for example, by computing the distance of the defect coordinates provided in inspection 1 of Step 501 relative to each of the defect coordinates provided in inspection 2 of Step 503. If the minimum value of a calculated distance is less than a certain threshold value, the defect is ignored as a commonly provided defect, and only defects of calculated distances that are greater than the threshold value are extracted. The method for extracting net defects is not limited to the above, and information on defects generated anew by carrying out processing with processing apparatus A can also be extracted.

In Step 505, the ID numbers of extracted defects, the number of defects, and a defect map or attribute information provided in accordance with the state of distribution are transmitted to inspection and analysis database 6. In Step 506, the number of extracted defects is compared against a predetermined threshold value. If the number of defects is smaller than the predetermined threshold value, it is determined that there is no abnormality, and in Step 507, the product wafer is sent to the next process. If the number of defects is larger than the predetermined threshold value, it is determined that there is abnormality, and processing jumps to Step 508. It is desirable that the number of defects used in this determination be the number of the above net defects, but the number of defects detected by inspection 2 can simply be used.

In Step 508, it is determined whether or not a review sampling is taken in accordance with a predetermined rule. For example, it is determined whether the number of extracted defects is less than a predetermined threshold value. If the number of defect points is greater than the threshold value, then, in Step 509, a sampling of coordinate points is taken in accordance with a predetermined rule. The rule for determining whether a sampling is required can prohibit increasing the points targeted for review without an upper limit corresponding to the number of defects, but the rule is not limited to this aspect. The sampling can be achieved, for example, by randomly extracting only a certain stipulated number. In Step 509, it is preferred that the number of coordinate points subsequent to sampling be less than a predetermined threshold value, but this sampling rule is not limited to that number. Further, information regarding which of the coordinate points were sampled can be transmitted to a database and can be referenced separately.

Next, in Step 510, a review, which is one form of in-depth analysis, is carried out. This review can be achieved using a Hitachi Limited-manufactured I-890 or other such apparatus comprising optical review functions, or a Hitachi Limited-manufactured RS-3000 or other such review SEM. The review, based on coordinates provided from an inspection apparatus, acquires images of the vicinity of the coordinate points, but the review is not limited to that function. Next, in Step 511, the images obtained in Step 510 are classified and recorded. Classification can be done manually by an operator, or can be done automatically using the method according to patent literature 1.

In Step 512, it is determined whether or not an analysis sampling will be taken in accordance with a predetermined rule. For example, a determination is made of whether the number of reviewed defects is less than a pre-set threshold value. If the number of defect points is greater than the threshold value, then, in Step 513, a sampling of coordinate points is taken in accordance with a predetermined rule. The rule for determining whether a sampling is required can prohibit increasing the points targeted for analysis without an upper limit corresponding to the number of defects, but the rule is not limited to this aspect. The sampling method can be the same as that in Step 509, or a different method can be used. Further, information about which of the coordinate points were sampled can be transmitted to inspection and analysis database 6 and can be referenced separately.

Next, in Step 514, data related to element information is acquired using EPMA, AES or other such apparatuses capable of acquiring element information for defects ascertained by the review, and this data is transmitted to database 6. In Step 515, production routing information related to a wafer determined to be abnormal is acquired from process management database 4. In Step 516, information on the relevant apparatus and chamber is acquired from apparatus status database 5.

In Step 517, information related to the apparatus and chamber that processed the wafer in which this abnormality occurred is displayed on display apparatus 8 by data analysis apparatus 7. In addition, information related to the processing apparatus, that processed the wafer, which includes when the wafer was processed, and which is stored in apparatus status database 5, can also be displayed. Further, the results of inspections and analyses related to the wafer can be displayed at the same time. A display is carried out in accordance with an inquiry from a user, but the invention can be configured such that a warning is issued from data analysis apparatus 7 prompting the user to make an inquiry related to the abnormal data at the time the abnormality is detected.

The frequency of product wafer inspections can apply to all wafers, or samplings can be taken in accordance with a certain rule. Further, the invention can be configured such that, even if steps 508 through 514 are not implemented, steps 515 onward can be implemented. Further, the abnormality determination of Step 506 is not limited to the number of extracted points, and a determination can be made on a standardized density of extracted points in an area of an inspected region. Further, the density of only closely clustered regional parts, or the density of only sparse regions, can be treated as decision criteria values using attribute information provided in accordance with the state of distribution.

Figure 7:
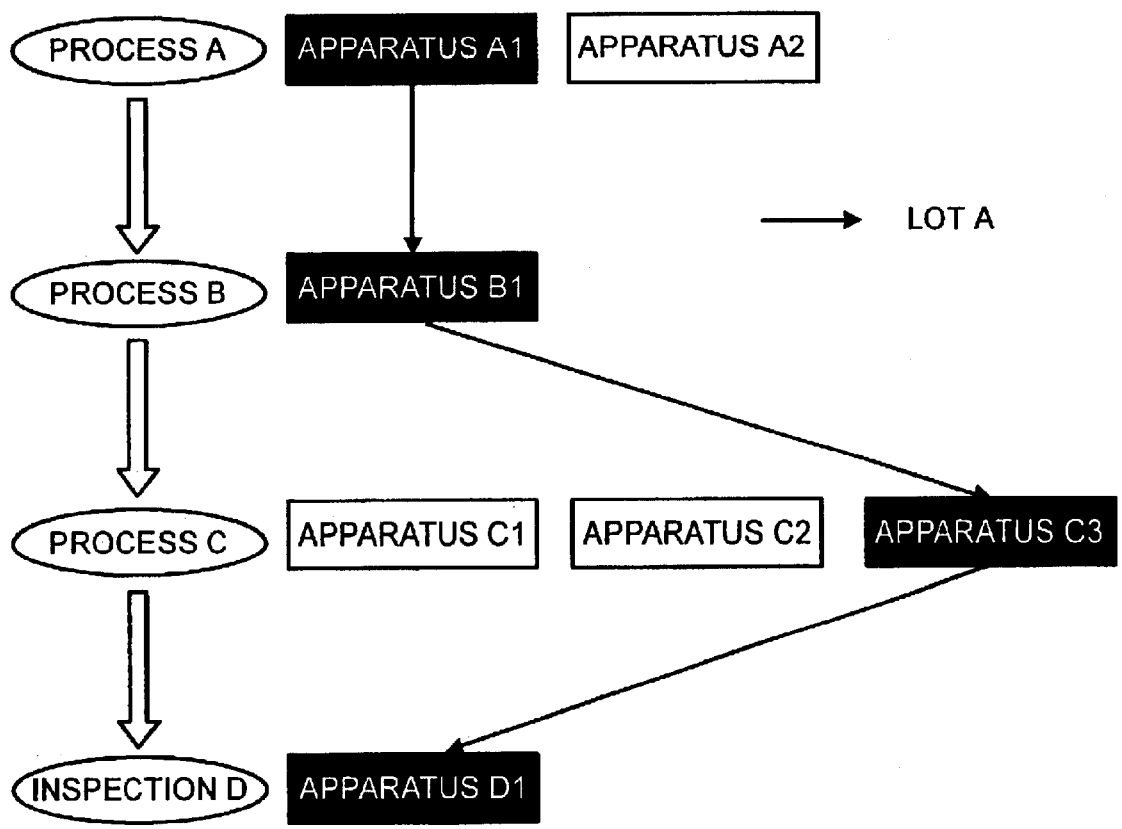
FIG. 7 and FIG. 8 are diagrams showing an embodiment of a data analysis and display method of the invention.
Figure 8:
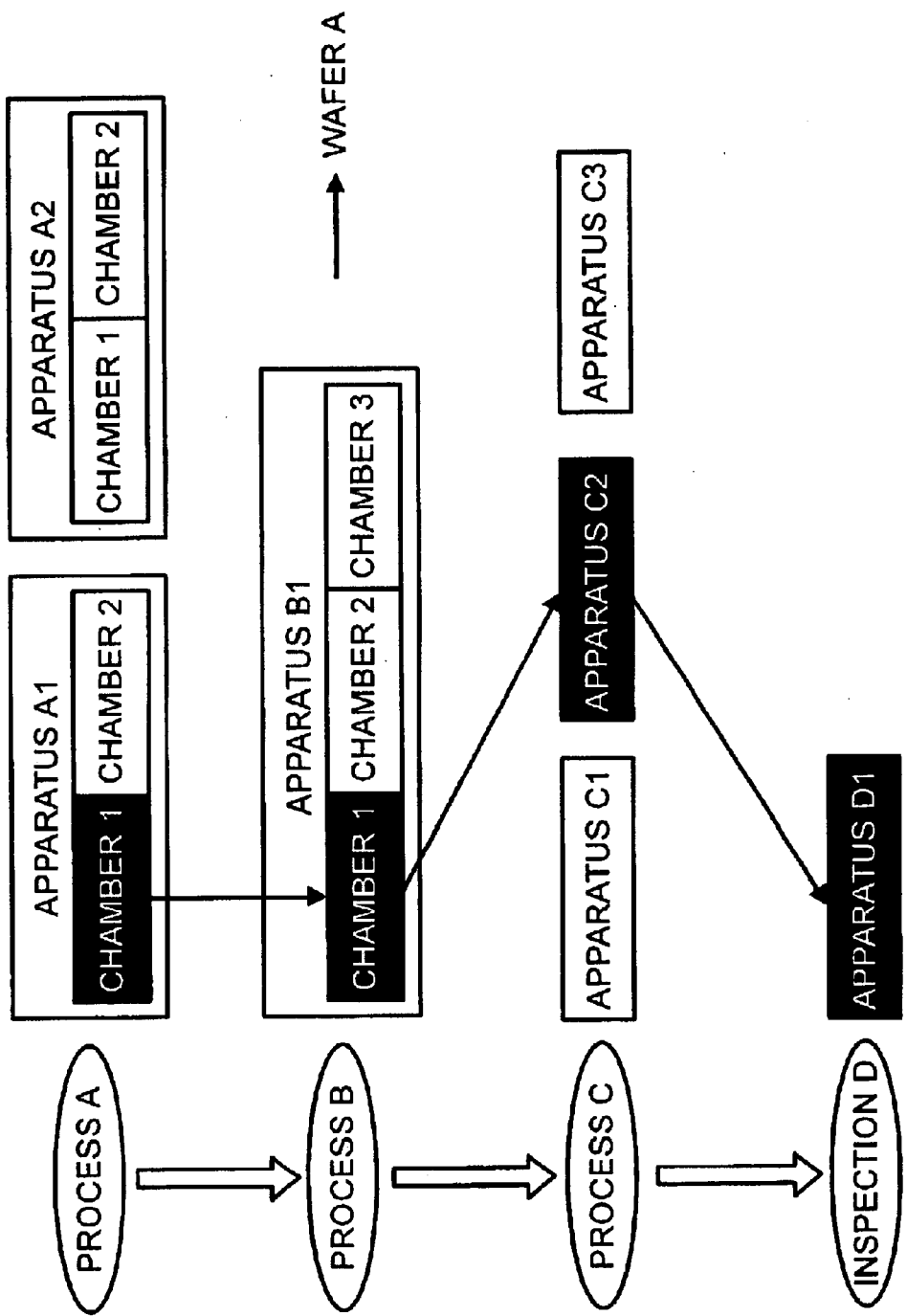

Next, the data analysis and display method for data analysis apparatus 7 is explained. First, an embodiment of a data analysis method that uses apparatus routing information is shown in FIGS. 7 and 8. For example, when an abnormality is detected in a certain wafer of Lot A in inspection D of FIG. 7, all seven apparatuses that exist in Processes A through C can be considered as candidates for the abnormality-generating apparatus. Here, apparatus routing information is acquired from process management database 4, and, as shown in FIG. 7, by presenting to the user the apparatus that processed Lot A, it is possible for the user to narrow down the candidates for the abnormality generating apparatus to four units, enabling the time required for in-depth analysis to be shortened.

As shown in FIG. 8, by presenting wafer unit and chamber unit information instead of lot unit and apparatus unit information, it is possible to limit the candidates for abnormality generating apparatus by chamber units. Further, by using a plurality of wafers in which abnormality is detected, and displaying them together with the wafer routing information, it is possible to assist in the narrowing down of the abnormality-generating apparatus candidates.

Figure 9:
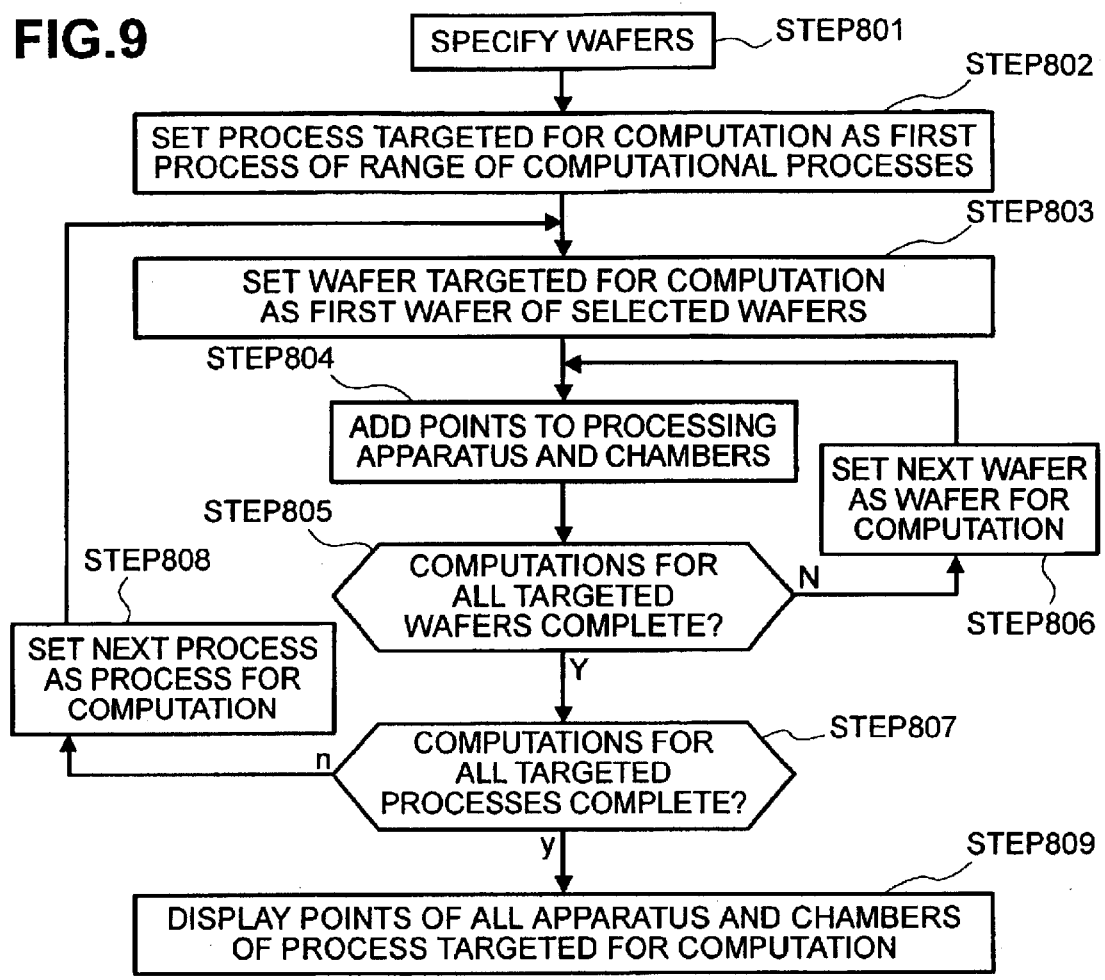
FIG. 9 is a flowchart showing an embodiment of a data analysis method of the invention.

FIG. 9 is a flowchart showing an example of a method for narrowing down abnormal apparatus candidates using apparatus routing information. First, in Step 801, a plurality of wafers that are used in route registration, and in which abnormalities were detected, are specified. In Step 802, a certain process, out of a range of processes for carrying out wafer computations, which are set as computation targets, is set as the first process targeted for computation. In Step 803, a certain wafer, out of the wafers specified in Step 801, is set as the first wafer to be used in computations. In Step 804, the processing apparatuses and processing chambers for the set wafer and process are acquired from process management database 4, and points are added to these processing apparatuses and processing chambers. In Step 805, it is determined whether or not computations for all targeted wafers were completed in this set process.

If computations were not completed, in Step 806, the next wafer is set as the wafer targeted for computation, and steps 804 and 805 are repeated. When all the computations for the wafers have been completed in Step 805, Step 807 determines whether or not the computations for all processed targeted for inspection were completed. If these computations were not completed, in Step 808, the next process is set as the process targeted for computation, and steps 803 through 807 are repeated. When all the computations for the processes targeted for examination have been completed, step 809 displays for the user the points for all the apparatuses and chambers of the process that was targeted for computation.

Figure 10:
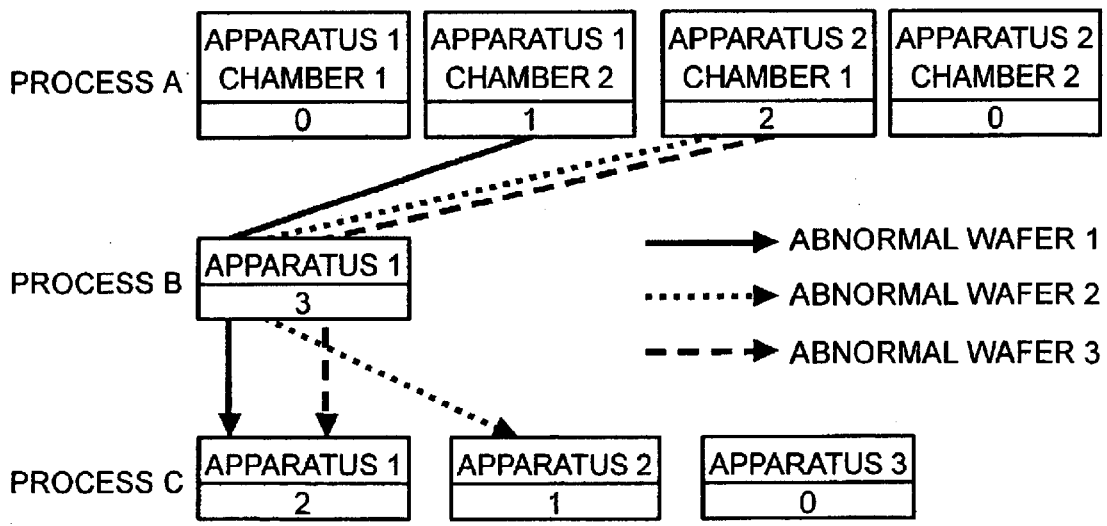
FIG. 10 is a diagram showing an embodiment of a data analysis results display method of the invention.

FIG. 10 shows an example of a display of the results of computation. This example shows three abnormal wafers. When the abnormal wafers have passed along the routes indicated by the respective arrows, the points shown in the figure are allocated to the respective processing apparatus and processing chambers. Here, for example, when apparatuses having two or more points, for example, as points for being extracted as problem candidates, are to be extracted, chamber 1 of apparatus 2 in Process A, apparatus 1 in Process B, and apparatus 1 in Process C are extracted.

Figure 11:
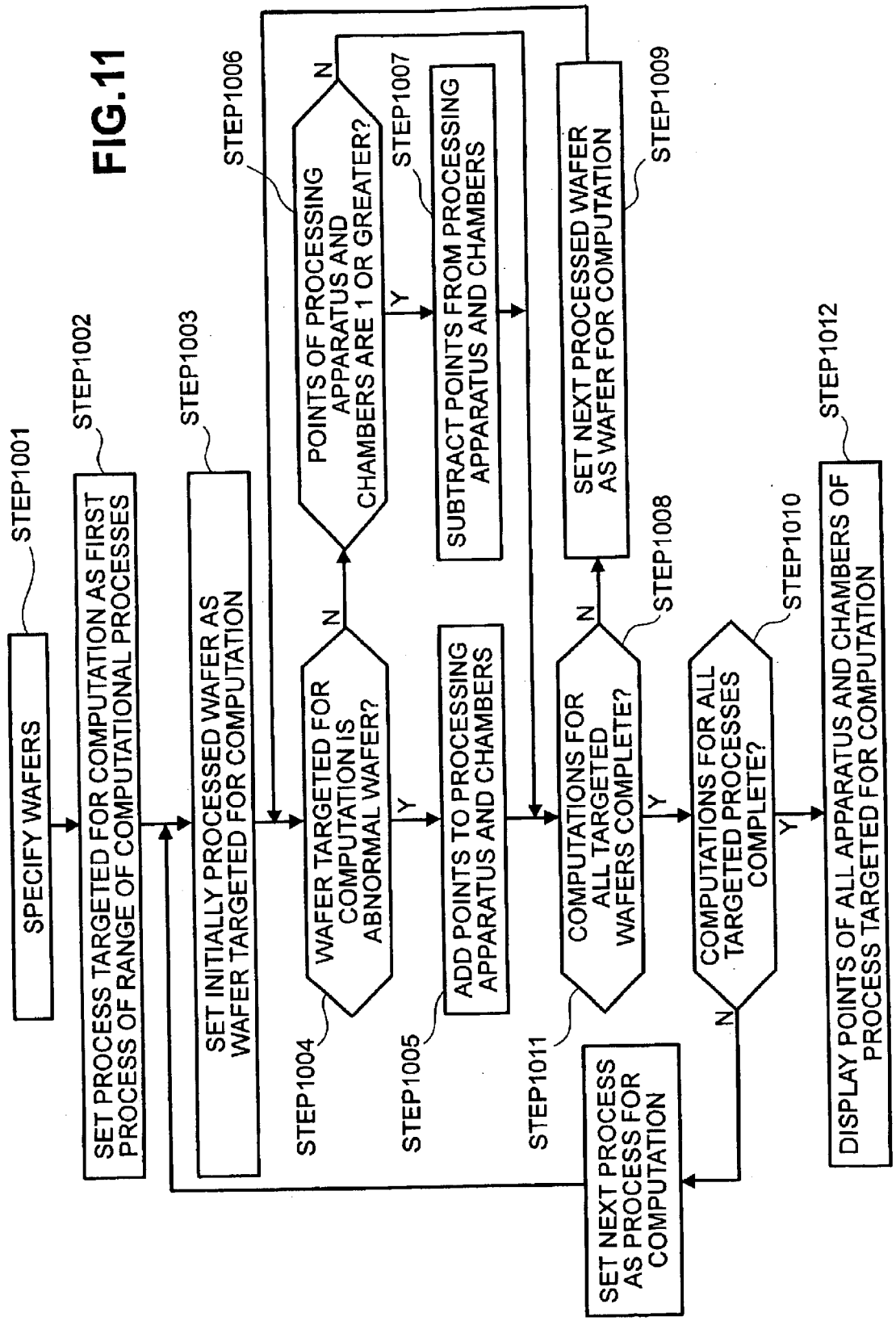
FIG. 11 is a flowchart showing another embodiment of a data analysis method of the invention.

Thus, it is considered highly likely that high point apparatuses and chambers generated abnormalities, and these apparatuses and chambers can be extracted as the targets of detailed investigations. In addition, by using the above together with routing information of wafers in which abnormalities were not detected, it is possible to narrow down the apparatuses for detailed investigation. This flow is shown in FIG. 11.

First, in Step 1001, a plurality of wafers used in route registration is specified. In Step 1002, a specific process, out of a range of processes for carrying out wafer computations, which are set as computation targets, is set as the first process targeted for computation. In Step 1003, out of the wafers specified in Step 1001, a wafer that was initially processed in the first computation target process, is set as the first wafer to be used in computation. In Step 1004, it is determined whether or not the wafer selected as the target of computation is a wafer in which an abnormality was detected. If it is a wafer in which an abnormality was detected, in Step 1005 the processing apparatuses and processing chambers for the set wafer and process are acquired from the process management database, and points are added to these processing apparatuses and processing chambers.

When, in Step 1004, it is determined that the wafer constituting the target of computation is not abnormal, then, in Step 1006, the processing apparatuses and processing chambers for this wafer and this process are acquired from the process management database, and a determination is made as to whether or not the points allocated to the processing apparatuses and processing chambers are 1 or greater. If they are 1 or greater, the points of the processing apparatus and chambers are subtracted in Step 1007. Further, if less than 1 was added, that is, if there are zero points, processing jumps to Step 1008 without carrying out the subtraction processing of Step 1007.

In Step 1008, it is determined whether or not the computations for all the wafers targeted in the set process have been completed. If these computations were not completed, in Step 1009, the wafer that was processed next in this process is set as the wafer targeted for computation, and steps 1004 through 1008 are repeated. If the computations of all the wafers are completed in Step 1008, then, in Step 1010, it is determined whether or not all the computations for the process targeted for examination have been completed. If these computations have not been completed, the next process is set as the computation target process in Step 1011, and Steps 1003 through 1010 are repeated. If all the computations for the process targeted for examination have been completed, then, in Step 1012, the points of all the apparatuses and chambers of the process that became the target of computation are displayed for the user.

In this example, in Step 1006, subtraction of points only when the points of the processing apparatuses and chambers are 1 or more is done for the following reason. When the state of an apparatus is normal, if the processing of Step 1006 is not implemented, the points of the apparatuses and chambers assume a negative value. Accordingly, when the state of the apparatuses and chambers switches to abnormal midway, the points of the apparatuses and chambers become zero or less until abnormal points, which exceed the negative points, are added. Since there is the possibility that the number of wafers processed in each of these apparatuses and chambers will differ, it is impossible to determine whether or not points, which indicate an abnormality, are contained in the apparatus and chambers from the relative amount of negative points. Accordingly, the invention is configured such that a negative value is not permitted in the points of each apparatus and chamber, and the points will always have positive values when there is the possibility that an abnormality occurred.

Further, in Step 1003 and Step 1009, the fact that the addition and subtraction of points in a specific process are carried out in the order in which wafers were processed is for the following reason. For example, it is supposed that, in a specific process, two wafers are processed in an apparatus in a normal state, and thereafter, two wafers are processed in a state in which an abnormality occurs. Here, when the computing of points is carried out in the order of processing, in accordance with the rules shown in FIG. 1, the points of this apparatus total 2, indicating points that signify an apparatus abnormality. However, when the processing order is not taken into consideration, and, for example, the computing for wafers processed in a normal state is executed subsequent to the computation for two wafers processed in a state in which an abnormality occurred, the points of this apparatus constitute zero, and it is impossible to obtain points that reflect the occurrence of an abnormality. Thus, to reflect changes over time in the occurrence of abnormalities in apparatus, the computing of points is carried out in the order in which wafers are processed.

Figure 12:
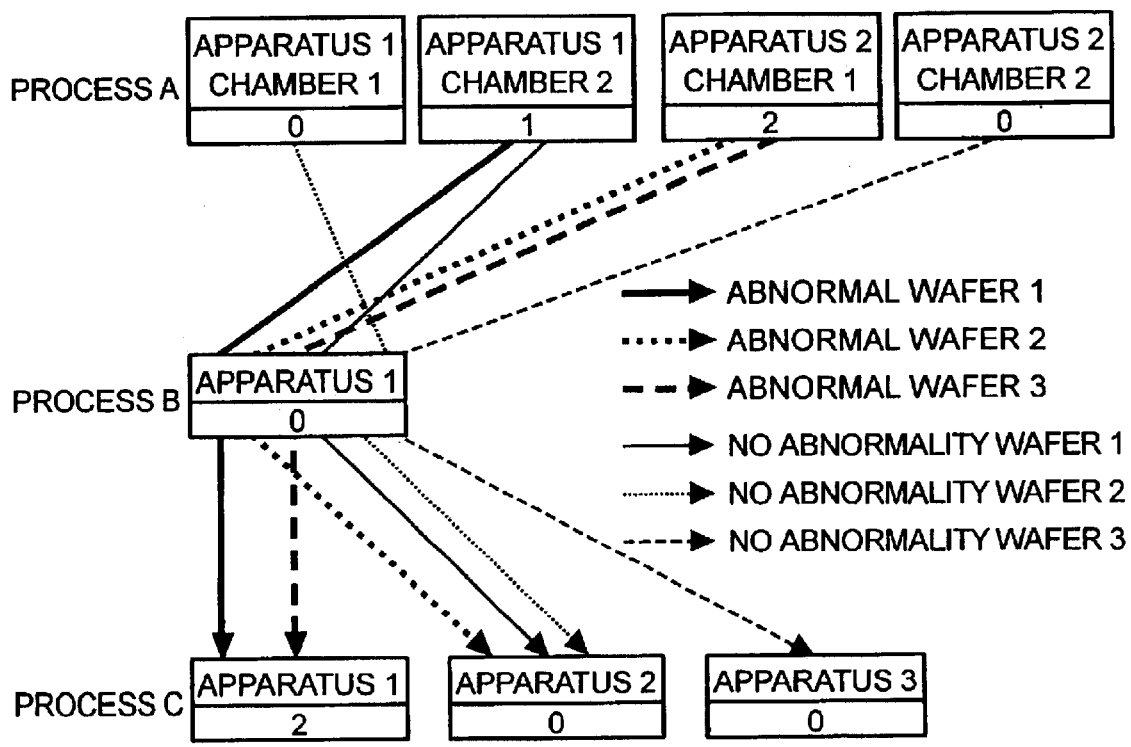
FIG. 12 is a diagram showing an embodiment of a data analysis results display method of the invention.

FIG. 12 shows an example of a display of computation results. The example shows three wafers without abnormalities that have been processed together with three abnormal wafers. The processes, apparatus configurations, and routes of the three abnormal wafers are the same as those shown in FIG. 10. It is supposed that the processing order in the respective processes was in the order of the abnormal wafers 1, 2, 3 and the wafers without abnormalities 1, 2, 3. Here, when the three wafers without abnormalities pass along the routes indicated by the arrows in the figure, in the end, points are allocated as shown in FIG. 12. For example, when the number of points to be extracted at this point as problem candidates is 2 or more, chamber 1 of apparatus 2 will be extracted in Process A, and apparatus 1 will be extracted in Process C. It is thus possible to set indicators for narrowing down problem apparatus candidates.

Wafers, which are targets of this method for narrowing down abnormal apparatus candidates using apparatus routing information, can be decreased by certain pre-set conditions. For example, the wafers can be limited to those for which the density of detected defects is greater than a predetermined threshold value. Further, the wafers can be limited to those that are determined to have closely clustered distribution regions in accordance with the method disclosed in Hisae Shabuya et al, "Spatial Pattern Recognition of Defect Point Distribution," Sixth Intelligent Mechatronics Workshop, pp. 279 and 280 (Aug. 30–31, 2001). In addition to the limitations, the wafers can also be limited to those for which the shapes of the limited regions resemble one another. Further, when attribute information is added to defects, the conditions of wafers targeted for computation can be narrowed down by using this attribute information.

For example, the density of defects can be calculated for the number of defects detected by an inspection apparatus by eliminating defects to which the attribute "false information (points provided as defects, but for which defects were not found in a review)" has been added, and by carrying out the above-described method for narrowing down abnormal apparatus candidates such that when this value is greater than a predetermined threshold value, the wafer is considered to be an abnormal wafer, and when this value is less than the threshold value, the wafer is considered to be without abnormalities. Further, wafers used in the above-described method for narrowing down abnormal apparatus candidates need. not be from different lots, and this processing can be applied to wafers in the same lot.

Next, an embodiment of a periodic analysis and display method, which uses defect distribution information comprising product QC information, is explained.

When an abnormality is detected in a certain wafer, an additional inspection is carried out for other, non-inspected wafers, which comprise the lot containing this wafer, and inspection data is acquired. Then, a graph, like that shown in FIG. 13, for example, is displayed having as axes wafer numbers and the number of defects detected in these wafers. From this graph, a user can see that large numbers of defects were detected at intervals of three wafers. Furthermore, the user can collate the graph against the processing apparatuses, which are obtained from apparatus routing information, and can conclude that an apparatus having a specific processing region at the intervals of three wafers, that is, an apparatus having three chambers, has the highest likelihood of being the apparatus causing the problem.

Further, the invention can be set up such that graphs, like the ones shown in FIG. 14, having as axes the chamber numbers of the processing apparatus and the number of defects of wafers processed by these chambers, are displayed. By displaying these graphs, a user can easily determine a trend, wherein, for example, no difference can be found in the distribution of the number of defects of each chamber in an apparatus having two chambers, but in an apparatus having three chambers, there are a large number of defects for a specific chamber, and the user can conclude that an apparatus having three chambers is most likely the apparatus causing the problem.

As shown in FIG. 15, a wafer map comprising information displayed for each wafer is also good. In accordance with this display, a user can conclude the randomness of the occurrence of a problem for each wafer in a lot. Moreover, as shown in FIG. 16, a map can also be displayed for each chamber. In accordance with this display, a user can grasp the trend of each chamber.

Figure 13:
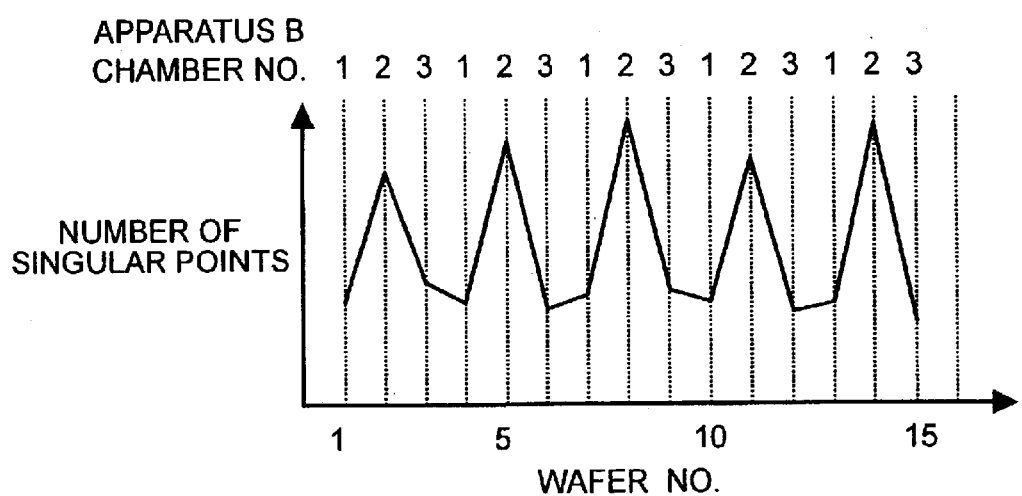

Further, the numerical values of the axis of the graph shown in FIG. 13 can be the density of defects instead of the number of defects. Then, values, which make use of distribution density, whereby a certain point group calculated by the method described in Hisae Shibuya et al. is either distributed in a closely clustered condition or is sparsely distributed, and which use only the densities of closely clustered regional parts or only the densities of sparse regions in analyses and displays, can be applied.

In addition, parts that are determined to be distributed in a closely clustered condition in the wafer maps of FIGS. 15 and 16, can be displayed in a highlighted form. With the highlighting method, the color of the plotting points can be changed, or the color of the region comprising the plotting points can be changed, as long as a user can distinguish the highlighted plotting points from other plotting points. Further, the invention can also be set up such that wafers determined to have closely clustered defect regions are displayed in a highlighted condition. Doing so makes it easier for a user to determine the randomness of fluctuations in defect distribution patterns.

In FIG. 16, the defect distribution of each of the chambers can be displayed by superimposing the defect distributions of a plurality of chambers. In doing so, when closely clustered parts exist in each chamber, the closely clustered parts can be more greatly emphasized more than by displaying each wafer one by one, thus enabling easier determination of map patterns. For this superimposed map, either the closely clustered portions can be displayed in a highlighted condition, or the superimposed wafers in which closely clustered portions exist can be displayed in a highlighted condition.

In the given example, inspections are carried out for all uninspected wafers, and inspection data is analyzed, but wafers to be inspected can also be sampled in accordance with a certain rule. The sampling rule could be, for example, that the wafers to be inspected can be the lowest common multiple of the number of chambers of the apparatus to be targeted. In this case, at the least, one or more wafers will be inspected from each chamber of the targeted apparatus. According to this rule, for example, when the targeted apparatus comprises a two-chamber apparatus and a three-chamber apparatus, if inspections are to be done on six successive wafers, out of the six wafers, it will be possible to obtain data on three wafers apiece processed in each chamber of the two-chamber apparatus, and on two wafers apiece processed in each chamber of the three-chamber apparatus. With regard to this data, it is possible to determine whether or not there are differences in each chamber by comparing the number or density of defects in each chamber as shown in FIG. 14.

Further, as another sampling rule, the wafers to be inspected can be set at two or more times the number of wafers for the apparatus having the maximum number of chambers. Even in this case, at the least, two or more wafers will be inspected for each chamber of each apparatus. Since the number of samples from each chamber increases the more the multiple is increased, the accuracy of determining whether or not differences are occurring in each chamber will be enhanced. Further, a sampling rule can be arbitrarily stipulated such that at the least one or more wafers from all of the chambers are included in a sampling.

This wafer inspection sampling rule determines beforehand the sum total of the number of wafers to be targeted for inspection based on throughput constraints, and can be changed in accordance with the number of apparatuses and the number of chambers for the scope of processing procedures being targeted for analysis. Further, both the number of wafers to be inspected and the wafer inspection sampling rule can be changed in accordance with the number of apparatuses and the number of chambers for the scope of processing procedures being targeted for analysis. Naturally, if inspections of wafers required for the defect distribution analysis explained above are carried out as ordinary inspections, it will not be necessary to carry out additional inspections when an abnormality is discovered in a wafer.

An embodiment of an output screen is shown in FIG. 17. Screen 1601 is called up by an inquiry from a user. This embodiment is characterized in that information related to product wafers is displayed together with information related to the processing apparatus related to these product wafers. The display is constituted from an area 1602 for displaying product wafer information, and an area 1603 for displaying information of the apparatus related to these wafers, which is stored in apparatus status database 5. Screen 1602 is further constituted from an area 1604, which shows wafer authentication information, an area 1605, which shows the information obtained by inspections and analyses of these wafers, and an area 1606, which shows the processing apparatus history obtained from the production routing information of process management database 4.

Embodiments of the displayed contents of each area are described next. In area 1604, information is displayed uniquely specifying the type of product, lot number, wafer number, scope of the processing procedure corresponding to Step 502 of FIG. 6, and information regarding from which wafer and inspection process the information shown in areas 1605 and 1606 was obtained. Instead of information about one wafer, functions enabling the display of an inspection information summary of wafers inspected in a relevant lot can be provided here. For example, the invention can be set up such that a "Summary" button is disposed beside the wafer No. display region, and pressing this button switches to a screen for displaying an inspection information summary of inspected wafers.

In area 1605, a map of wafer inner surface defects detected by an inspection apparatus, and the detected number are displayed. In addition, when an image of defect coordinates has been acquired, this image data can be displayed at the same time. Further, when element information regarding defects discovered at defect coordinates has been acquired, the element information can be displayed at the same time. When attribute information provided in accordance with the exterior of defects is added here, a map can be displayed by changing the color or shape of each attribute, making it possible to distinguish between the points on the map. In addition, defect attribute information provided in accordance with the external appearance and state of defect distribution can be displayed together with defect image information and clement information. Further, a region of high distribution density can be divided from other regions on a map, and the high distribution density region can be displayed in a highlighted condition to distinguish it from other parts. Further, the ratio of each classification can also be displayed. Furthermore, the detected density of defects can be displayed instead of the number of defects.

In area 1606, processing procedures corresponding to Step 502 of FIG. 6 and a history of the processing apparatuses that processed these wafers, data that were obtained from production routing information, are displayed. The example in FIG. 17 shows three units of processing apparatuses for a sputtering process, and each apparatus has three chambers. Similarly, it shows two units of processing apparatuses for an application process, four units of processing apparatuses for an exposure process, two units of two chambers each of processing apparatuses for an etching process, and two units of apparatuses for a washing process. Then, it shows that these wafers were processed by chamber 1 of sputter process apparatus No. 3, application process apparatus No. 1, exposure process apparatus No. 2, chamber 1 of etching process apparatus No. 1, and washing process apparatus No. 1.

In area 1603, data related to apparatuses and stored in apparatus status database 5, is displayed in chronological order for the processing apparatuses displayed in area 1606. The example in FIG. 17 displays defect density. In the graphs, the horizontal axes represent dates, and the vertical axes represent numbers of defects per unit area. The vertical lines 1607 in the graphs indicate the dates on which these wafers were processed. In this case, although defect density increases around the date of processing by exposure process apparatus No. 2, no changes are evident in the other apparatus. From this information, a user can conclude that, from the standpoint of defect density, the problem most likely is being generated by exposure process apparatus No. 2. Further, the invention can be set up such that the apparatus name display parts become pull-down menus, enabling data comparisons to be easily carried out by calling up data of other apparatuses or chambers.

The display information in area 1603 can be switched by selecting tabs. An example of a screen for displaying a summary of inspection information of wafers inspected in a relevant lot, instead of the information about one wafer, is shown in FIG. 18. This information is displayed in area 1605. For example, it is possible to move to this screen by pressing the "Summary" button (not shown) of area 1604. In area 1605, an example is given in which the horizontal axis represents wafer numbers and the vertical axis represents defect density. Further, the processing chamber number can be displayed by clicking on the apparatus mark displayed in area 1606. In addition, the display item of the horizontal axis can be changed to a by-chamber display, and the graph can be displayed in the format shown in FIG. 14. Further, the vertical axis display item can be changed, and the graph can be displayed in the format shown in either FIG. 15 or FIG. 16.

Figure 19:
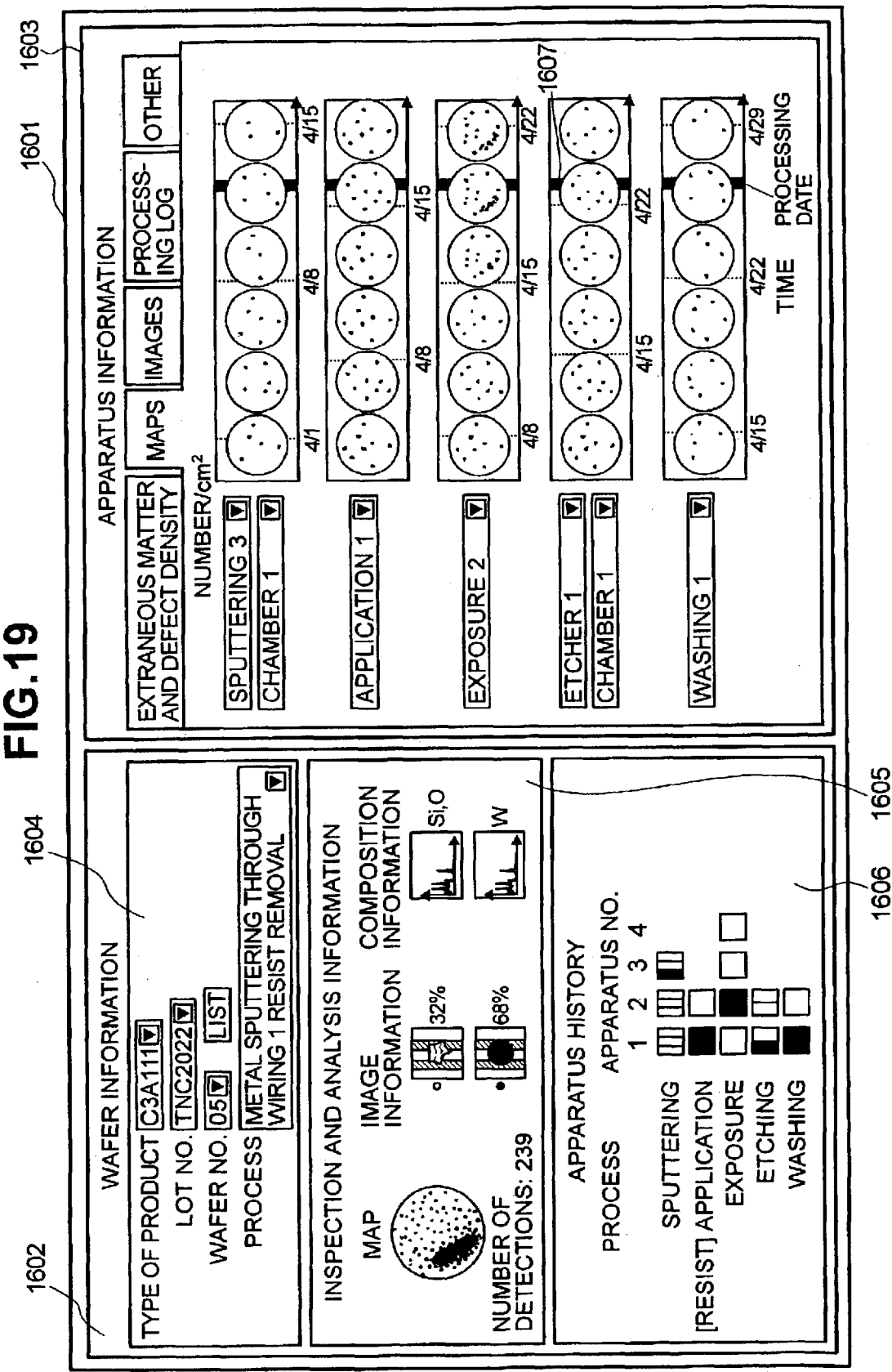

Examples of other data displays of area 1603 are shown in FIGS. 19 through 22. FIG. 19 is an example showing map data. When the distribution of defects detected in a product wafer has a characteristic bias, a map of defects generated in a processing apparatus is arranged in chronological order and displayed like this, making it easy for a user to determine whether or not the same defect distribution bias as that of the product wafer is being generated around the time of product wafer processing. That is, it is possible to narrow down the apparatus generating the problem. For example, in FIG. 19, the same defect distribution bias as that of the product wafer can be observed around processing time in exposure apparatus 2. Accordingly, when the same results are arrived at with the extraneous matter and defect density information, it can be concluded that the problem most likely is being generated in exposure apparatus 2.

Figure 20:
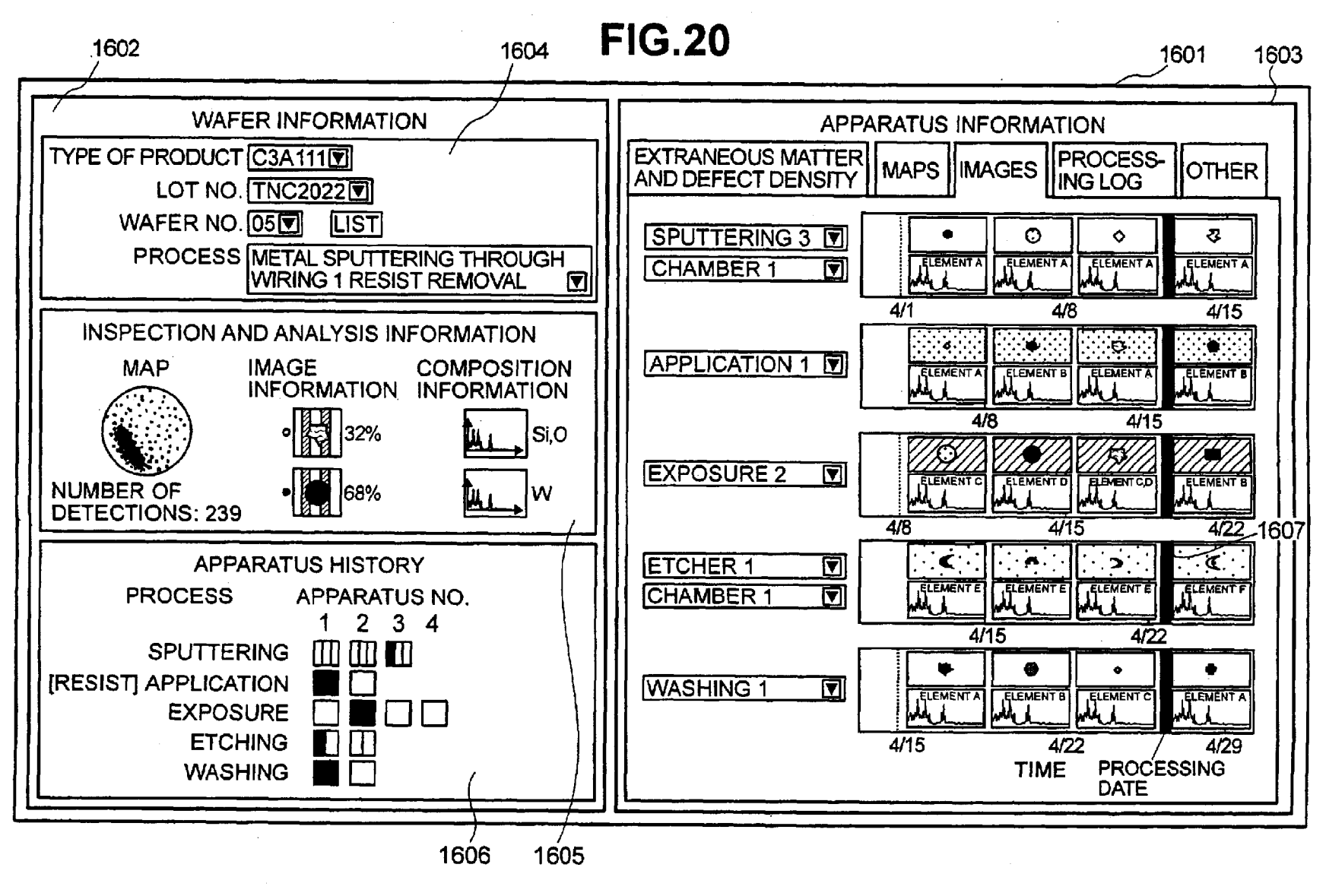

FIG. 20 is an example showing the generated defects of either each processing apparatus or each chamber as image information. Analysis information pertaining to element information can be displayed together with image information. Further, detected elements can be displayed. In addition, a substance name can be identified, and this substance name can be displayed. A user can compare either defect exterior image or element information obtained from the product wafer displayed in area 1605 against either defect exterior image or element information of each apparatus displayed in area 1603, and can use this as data for making a decision about extracting apparatuses that are possibly related to the abnormalities. For example, if the exterior image of the product wafer and the exterior images of apparatus information are compared in FIG. 20, defects that are similar in both defect size and defect shape can be observed in exposure apparatus 2. From this, a user can conclude that exposure apparatus 2 is likely to be the cause of the generation of an abnormality in the wafer.

Figure 21:
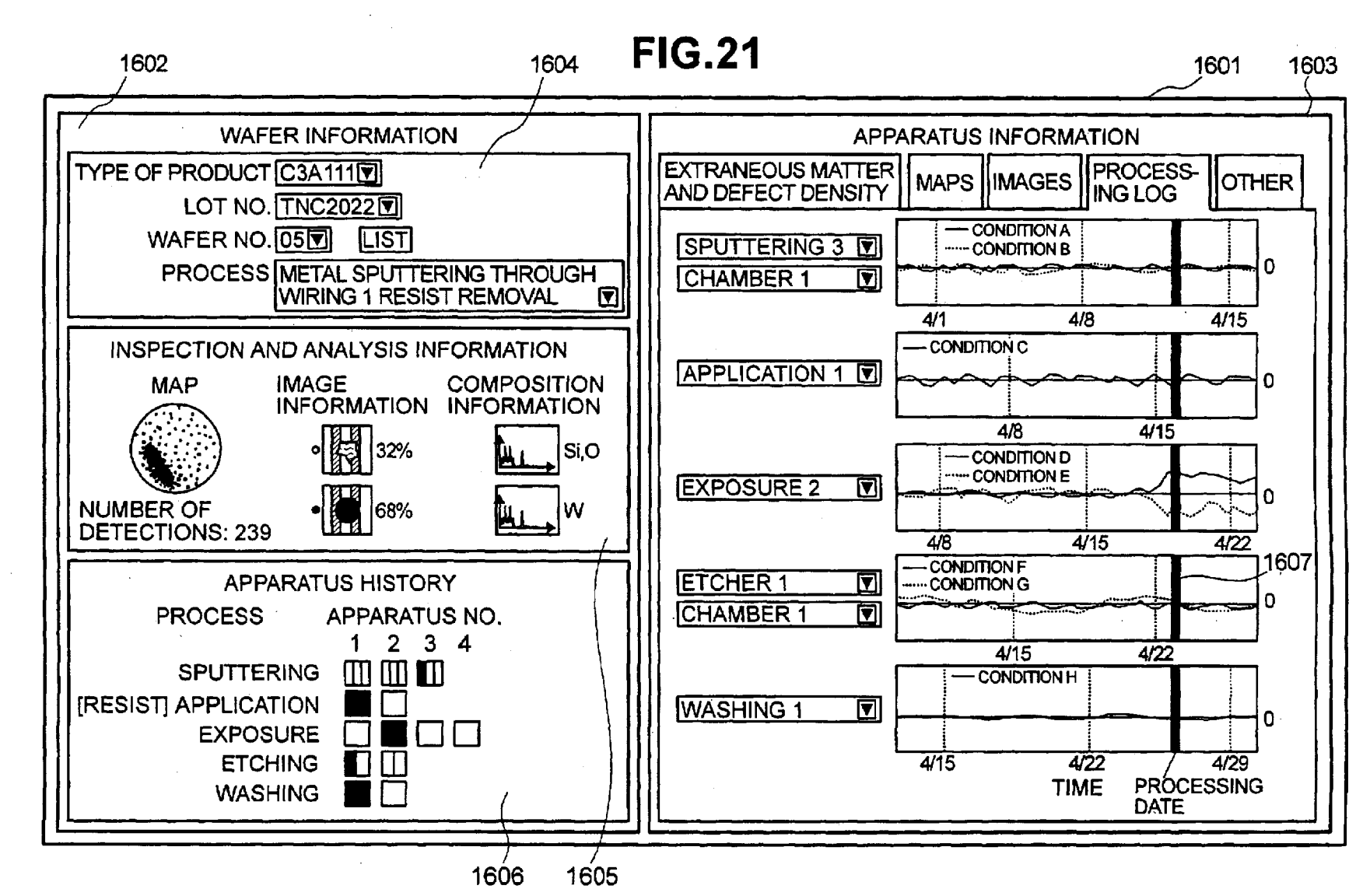

FIG. 21 is an example in which the average values of deviations from a set value are acquired as representative values, and the transitions thereof are displayed as processing log information in the processing log information of various processing conditions obtained for each processing apparatus. When a processing condition abnormality causes an abnormality in wafers, a user can evaluate the degree of agreement between the processing time of an abnormal wafer indicated by 07, and the deviation from the set value of the processing condition and can apply this data to making a decision about extracting apparatuses that are possibly related to the abnormalities.

For example, in the graphs of FIG. 21, exposure apparatus 2 exhibits a large displacement in the vicinity of the processing date of the abnormal wafers. From this, a user can conclude that exposure apparatus 2 is likely the cause of abnormalities in the wafers. Further, the invention can be set up such that, for example, if a region on a graph is clicked at this time, a log, which is recorded chronologically during processing, is displayed for wafers that were processed in this time period instead of the representative values plotted in area 1603.

FIG. 22 is an example showing apparatus maintenance information as other information. In a manufacturing process, there are times when abnormalities are suddenly generated, such as defects rapidly increasing due to improper apparatus maintenance. Thus, sometimes the cause of abnormalities can be inferred by understanding the correspondence of maintenance times and times when apparatuses generate abnormalities. From FIG. 22 it is clear that part replacement took place in exposure apparatus 2 immediately prior to processing the product wafers in which abnormalities were detected. From this, a user can conclude the likelihood that the part replacement caused some sort of anomaly in exposure apparatus 2, which had been determined the most likely cause of the problem based on other information explained up to this point.

The chronological transitions of the ratios of classes of defects generated in each processing apparatus or in each chamber can be displayed together with the processing time of wafers in which abnormalities occurred. When an abnormality is generated in an apparatus, and the percentage of generated abnormalities changes, using this display enables a user to apply this information to making a decision about extracting apparatuses that are possibly related to the abnormalities. Further, with regard to the production routing information displayed in area 1606, a plurality of wafers can be specified in a wafer selection screen not shown in the figure, and, as explained in FIGS. 10 and 12, the product routing information and number of points thereof can be displayed.

The graphs of area 1603 are examples in which the horizontal axis, the date axis, is adjusted so that the vertical lines 1607 showing the processing date in each graph are in the same location, but these graphs can be displayed by making the date display of each graph the same location.

The display format is not limited to the presented embodiments, and can be configured such that information related to wafers determined to have abnormalities and information related to processing apparatus can at all times be displayed together with information of the times these wafers were processed in the processing apparatus. Thus, in realizing this embodiment, it is not always necessary for both process management database 4 and apparatus status database 5 to be provided, but it is preferable that at least one or more databases be provided.

Data collected in apparatus status database 5 and inspection and analysis database 6 does not necessarily have to be collected for all the items described in the embodiment, but it is preferable that one or more of the items described in the embodiment be carried out. However, since inferences about the apparatus generating the problem can be carried out in a more multilateral fashion, the more numerous the types of data being collected are, the more reliable the inferences that can be expected. Further, the databases and analysis apparatus shown in 104 through 107 of FIG. 2 can be maintained inside the same apparatus, and can also be maintained by dividing them into arbitrary combinations.

Figure 23:
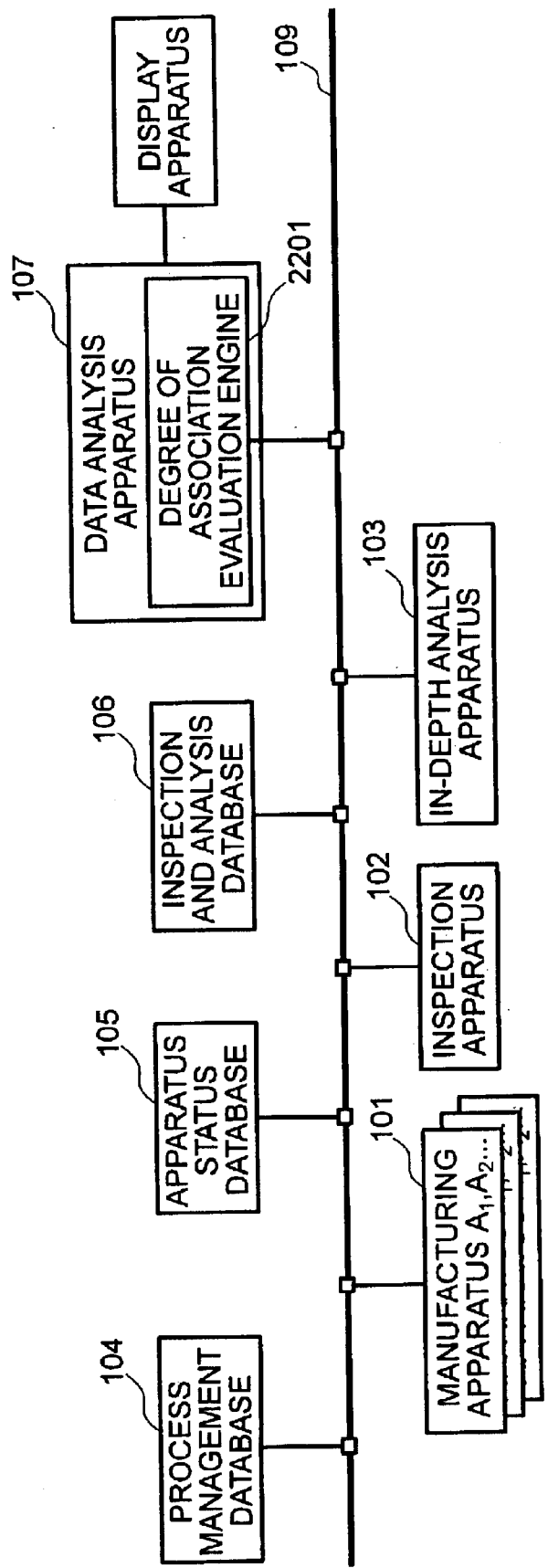
FIG. 23 is a diagram showing an example of a configuration of the invention.

FIG. 23 is a diagram showing a second embodiment of an apparatus configuration of the present invention. This embodiment differs from the first embodiment in that it has an association evaluation engine 17. This association evaluation engine has two essential functions. The first takes into account the chronological transition of apparatus QC information, which is collected separately from processing apparatuses or chambers and stored in apparatus status database 5, and either product QC information obtained from product wafers or chronological transition fluctuations of defect density at the time processing is implemented; and the second evaluates which processing apparatus or chamber is a problem apparatus candidate.

Next, the application procedure of the second embodiment for product wafers is explained. According to a configuration that includes association evaluation engine 17, the application procedure of this method replaces Step 517 and beyond of the flowchart shown in FIG. 6 with the flowchart shown in FIG. 24.

Figure 24:
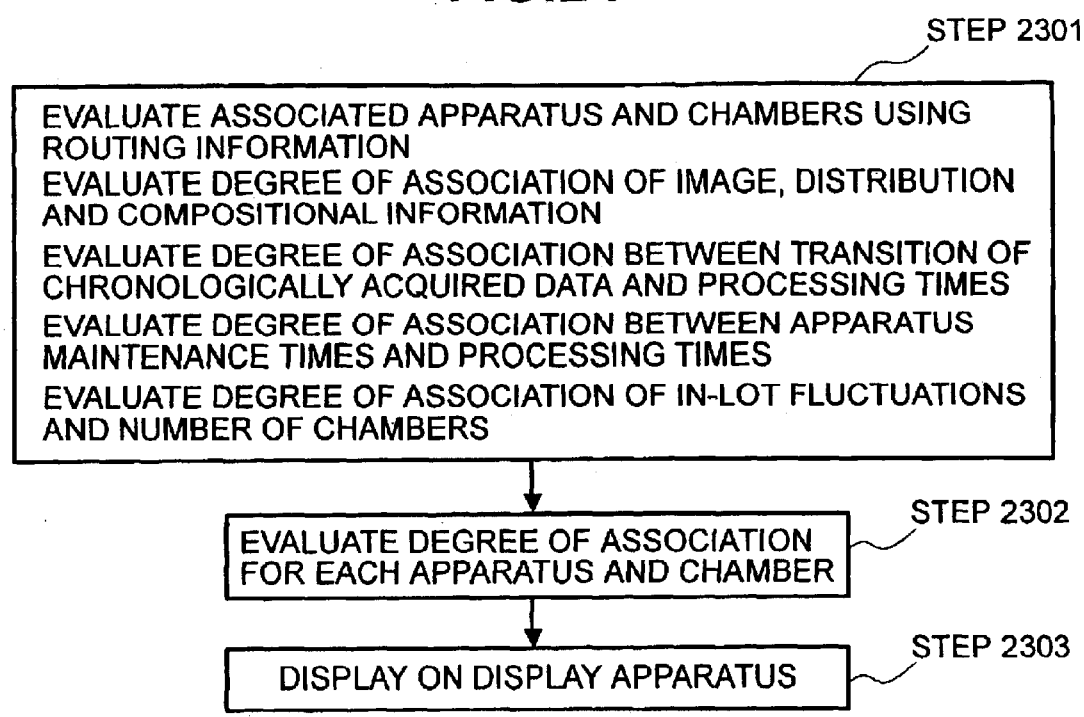
FIG. 24 is a flowchart showing an embodiment of a data analysis method of the invention.

In Step 2301 of FIG. 24, processing apparatuses and chambers associated with wafers in which problems have occurred are evaluated using apparatus routing information. Further, with regard to pattern fluctuations in the distribution of defects in wafers in a lot, the degree of association between apparatuses and the number of chambers of the processing apparatus is evaluated by periodic analysis. With regard to defect maps, defect images, qualitative data, such as element information spectral data obtained from the element information analysis apparatus, which is one of the in-depth analysis apparatuses, and defect attribute information, the degree of association of data obtained from apparatus status database 5 and data obtained from the product wafers is evaluated. Further, with regard to the transition of defect density, the transition of the frequency of defects by attributes, or the transition of deviations from processing log settings, the degree of association between the absolute values thereof or the amount of fluctuation and the processing period of the wafers determined to be abnormal is evaluated. In addition, the degree of association between apparatus maintenance periods and the processing period of the wafers determined to be abnormal is evaluated.

In Step 2302, the evaluation values of in Step 2301 are totaled for each apparatus and chamber, and the degree of association with the generation of abnormalities is evaluated for each apparatus and chamber. In Step 2303, apparatuses having a high correlation with generated abnormalities are displayed.

The evaluation methods of Step 2301 are explained next. Evaluations of associated apparatuses and chambers using production routing information can be achieved by automating the specification of wafers targeted for computation by the methods explained, for example, in FIG. 9 or FIG. 11. That is, the specification of wafers targeted for computations in either Step 801 in FIG. 9 or Step 1001 in FIG. 11 is automatically set in accordance with a specific rule, and the number of points of each apparatus and chamber shown in either FIG. 10 or FIG. 12 is automatically calculated in accordance with the flow of either FIG. 9 or FIG. 11. A wafer specification rule can be carried out by a time specification, such as within the past few days from the present point in time, and, further, the rule can be a number of wafers specification, such as no more than a certain number of inspected wafers, or it can be a lot specification, such as not more than a certain number of the inspected lots. Then, a specific threshold value is set beforehand for the number of points of each apparatus, and apparatuses and chambers that exceed the threshold value are given an evaluation value of 1, and apparatuses that are less than the threshold value are given an evaluation value of 0.

Next, an embodiment of an association evaluation of in-lot fluctuations and number of chambers is explained. Data regarding the wafers in a lot is calculated as shown in FIG. 12. Then, a specific threshold value is set beforehand for the vertical axis value in FIG. 12, for example, the number of defects, and it is determined whether or not wafer numbers that exceeded the threshold value constitute an arithmetic progression. This can be determined by whether or not the difference values of the wafers exceeding this threshold value are the same. If they constitute an arithmetic progression, in-lot fluctuations are considered to have the same periodicity as the common difference of the arithmetic progression, and, for example, an evaluation value of 1 is assigned to apparatuses having the same number of chambers as the common difference of the arithmetic progression.

Further, as another embodiment of this evaluation method, for example, the graph in FIG. 12 is differentiated; wafer numbers having differential values greater than a specific predetermined threshold value are treated as the peaks, and the presence of periodicity relative to the peak wafer numbers can be determined in the same way as the above-described method.

In another embodiment of this evaluation method that, for example, uses the graphs shown in FIG. 14, a general significant difference test is carried out as a statistical method for determining the dispersion of the number of defects of each chamber, and an evaluation value of 1, for example, can be assigned to apparatuses determined to have a significant difference. Another embodiment using FIG. 14 calculates an average value for each chamber number, and the absolute value of the difference of two chambers is calculated relative to the calculated average values for all combinations. Then, when a calculated value exceeds a predetermined threshold value, it is determined that there is a significant difference for each chamber, and of the two chambers used in the computation of this calculated value, the chamber that is in a poor state, in which either the number of density or defects is high, is assigned an evaluation value of 1.

Here, as the vertical axis value in the evaluations, for example, only the density of the dense defect region of each wafer specified using the method disclosed in Hisae Shibuya et al., or the density of the region in which defect distribution is sparse, or the density of a region exclusive of a dense defect region, can be used instead of the number or density of defects. At this time, the computations of the regions can be done by targeting computations at maps on which the wafer maps of each chamber are superimposed, instead of targeting computations at each wafer. Further, a value assigned relative to the presence or absence of a dense defect region can be used as the vertical axis value. For example, the evaluation can be carried out by assigning a 1 to wafers determined to have a dense defect region and assigning a 0 to wafers determined not to have a dense defect region.

Another embodiment of this evaluation, a method that uses the wafer map shown in FIG. 15, is described next. First, using a map similarity evaluation method, which is explained below, degrees of similarity based on each wafer, such as the degree of similarity of each wafer based on wafer No. 1, the degree of similarity of each wafer based on wafer No. 2, and so forth, are respectively calculated, and a graph that has wafer numbers and degrees of similarity as its axes is created in proportion to the number of wafer numbers. Then, the fluctuation of this degree of similarity relative to the wafer numbers of this graph is evaluated for all prepared graphs using the method explained above for FIG. 12, and if there is even one graph that is determined to have periodicity, for example, an evaluation value of 1 is assigned to the corresponding apparatus.

Further, another embodiment of this evaluation, a method that uses the wafer map shown in FIG. 16, is described next. In the wafer map of each chamber, the method explained for FIG. 15 is used for each chamber, and an average value of the degree of similarity is calculated for each chamber. Then, when this average value is less than a specific predetermined threshold value, an evaluation value of 1, for example, is assigned to this chamber. This is to indicate that a common pattern is manifested in the defect distribution of the wafers processed in this chamber.

Next, an embodiment of a similarity evaluation of a defect image is explained. First, in the defect image of each apparatus and chamber acquired as apparatus QC data, the features of the defect region are calculated as a quantitative value. Features of the defect region, such as the brightness, area, aspect ratio, degree of roundness, brightness variations, and so forth, can be used.

Defect regions can be specified by a person; moreover, images of the same background in which defects do not exist can be acquired as reference images together with defect images, and defect regions can be specified in accordance with inter-image computations. It does not really matter what method is used as long as it is a method for specifying a defect region. Next, in exterior images of defects acquired as product QC data, feature values are calculated in the same manner. Then, in a feature value space, which has feature values as coordinate axes, the distances between points specified by defect images of wafers in which abnormalities have been detected, and points specified by defect images of each apparatus and chamber are computed. A determination can be made that the shorter these distances, the higher the degree of similarity of the images. Then, n apparatuses and chambers are extracted in order from the highest degree of similarity. An evaluation value of n is assigned to apparatuses and chambers with the highest degrees of similarity, and evaluation values are allocated such that the lower the degree of similarity, the smaller the evaluation value becomes.

Figure 25:
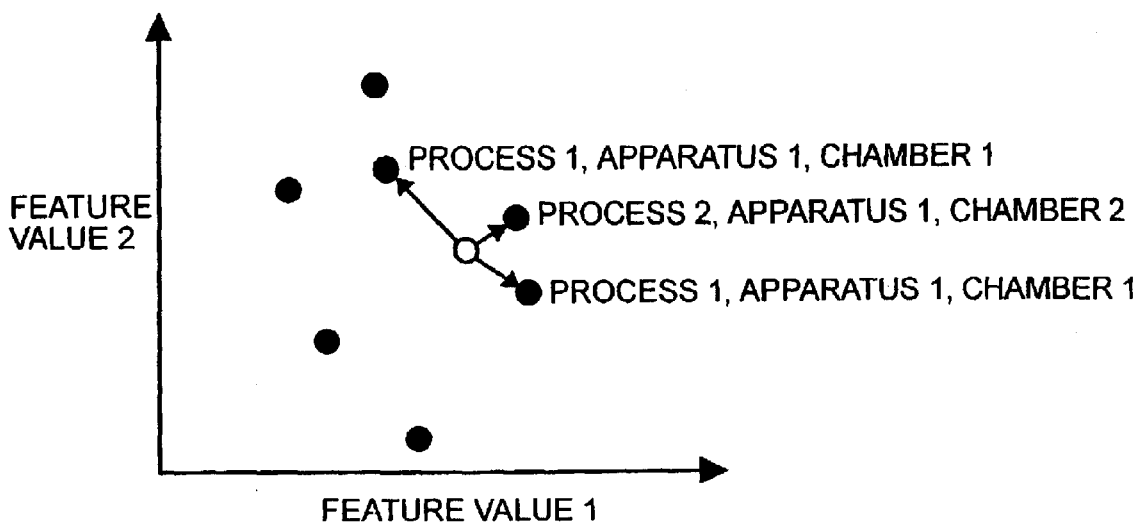
FIG. 25 and FIG. 26 are illustrations showing an embodiment of a data analysis method of the invention.

FIG. 25 shows an example, from among the evaluation value-allocating examples, in which there are two feature values. In this case, the feature value space constitutes a two-dimensional space prescribed by feature value 1 and feature value 2. Points specified by the defect images of each apparatus and chamber are plotted as black dots. Here, it is supposed that the feature value of the exterior image of defects of the product wafer are specified in the location plotted with a white dot. When, for example, three apparatuses and chambers are extracted in order of similarity from the highest to the lowest, chamber 2 of apparatus 1 of process 2, chamber 1 of apparatus 1 of process 1, and chamber 1 of apparatus 1 of process 1, as shown in FIG. 25, are extracted, and assigned evaluation values of 3, 2, and 1, respectively. When m feature values are utilized, this embodiment is implemented in the same way in an m dimensional feature value space.

Figure 26:
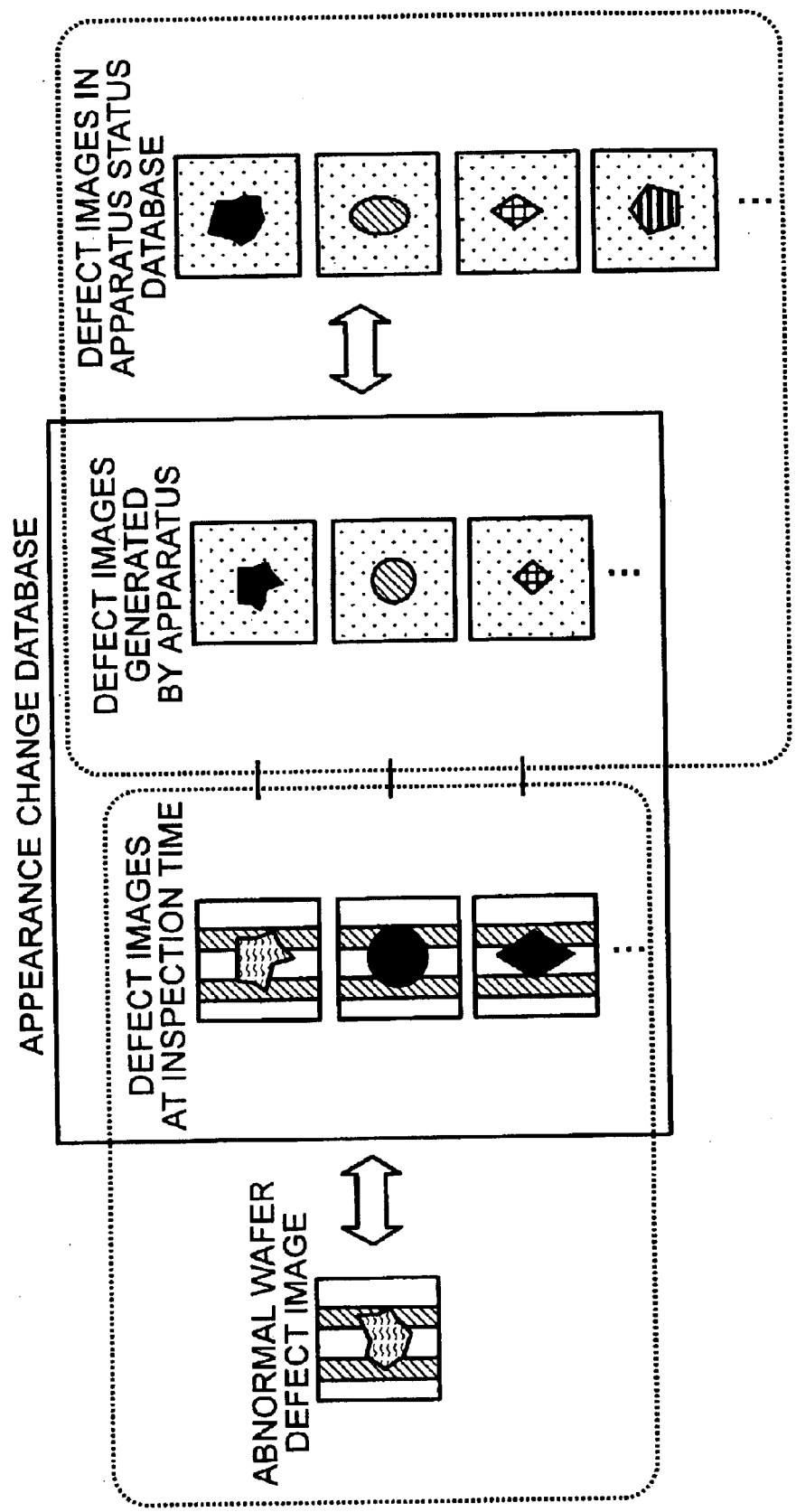

In this example, there are times when an image of defects in an apparatus and an image obtained at inspection time in an actual product are not always completely the same. For example, in FIG. 6, this is because the defects generated in the process of Processing A were inspected subsequent to undergoing the procedures of Processing B and Processing C. Accordingly, as shown in FIG. 26, exterior images are acquired beforehand by a defect inspection and review immediately after wafers undergo each processing process, and, in addition, in a defect inspection process in which product QC is carried out, exterior images are acquired by carrying out a review of defects based on defect coordinate points obtained in defect inspections conducted immediately after the processing procedures.

The former exterior images are "images of defects generated by an apparatus," and the latter exterior images are "images of defects at inspection time." Then, an exterior variation database, which associates "images of defects generated by an apparatus" and "images of defects at inspec-tion time," is constructed. With regard to exterior images acquired by apparatus QC, first, an evaluation of the degree of similarity with "images of defects at inspection time" from this database is carried out, and similar images are specified. Similar images are retrieved from apparatus status database 5 by searching for "images of defects generated by an apparatus" corresponding to specified "images of defects at inspection time." By so doing, it is possible to implement matching for inferring the generating apparatus even for external appearances of defects, which become different by undergoing processes. It is desirable that this exterior variation database be updated regularly.

Figure 27:
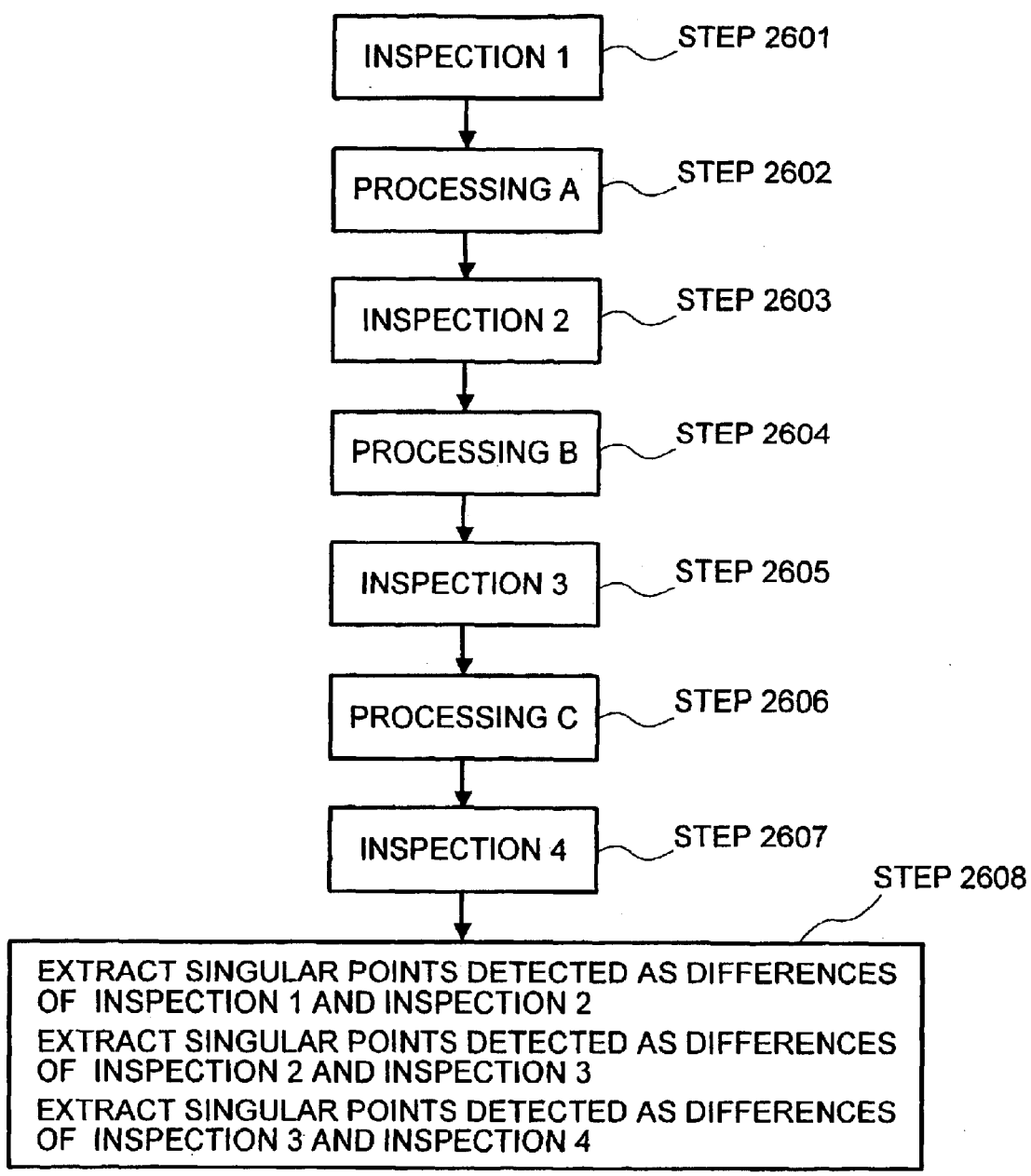
FIG. 27 is a flowchart showing an embodiment of a data analysis method of the invention.

Further, as images of apparatus status database 5, images obtained by implementing steps 2601 through 2608 of FIG. 27 can be registered instead of steps 401 through 404 of FIG. 5. That is, in Step 2601, wafer inspection 1 is carried out, and subsequently, in Step 2602, Processing A is implemented. In Step 2603, wafer inspection 2 is implemented, and subsequently, in Step 2604, Processing B is implemented. In Step 2605, wafer inspection 3 is implemented, and subsequently, in Step 2606, Processing C is implemented. In Step 2607, wafer inspection 4 is implemented. Then, in Step 2608, the differences of inspection 1 and inspection 2 are detected, and the coordinate points of defects generated by Processing A are extracted.

Similarly, the differences of inspection 2 and inspection 3 are detected, and the coordinate points of defects generated by Processing B are extracted. Likewise, the differences of inspection 3 and inspection 4 are detected, and the coordinate points of defects generated by Processing C are extracted. Subsequent procedures are carried out in the same way as Steps 405 to 412 of FIG. 5.

By so doing, the coordinates of defects generated in each processing apparatus and chamber can be acquired. Further, by acquiring exterior images in defect inspection processes in which product QC is carried out based on these coordinate points, exterior images of defects that were generated in each processing apparatus, and subsequent to processing-related changes, are obtained. Using these exterior images, it is possible to implement matching for inferring the generating apparatus even for defects in which the external appearance changes after undergoing processing procedures.

Alternatively, the associative memory achieved by a neural network can be used. An example of an associative memory model, Associatron, is disclosed in Nakano Kaoru, *Associatron*, published by Syokodo, pp. 13–14, 18–21, 106–107 (Japan, 1979). This is an interconnecting neural network, and is a model in which neurons take one of three values, −1, 0 or 1. By teaching Associatron the images of defects that occur in each apparatus unit, it is possible to retrieve association images, which are closely related to images obtained in inspection processes, even when these images do not completely match.

Figure 28:
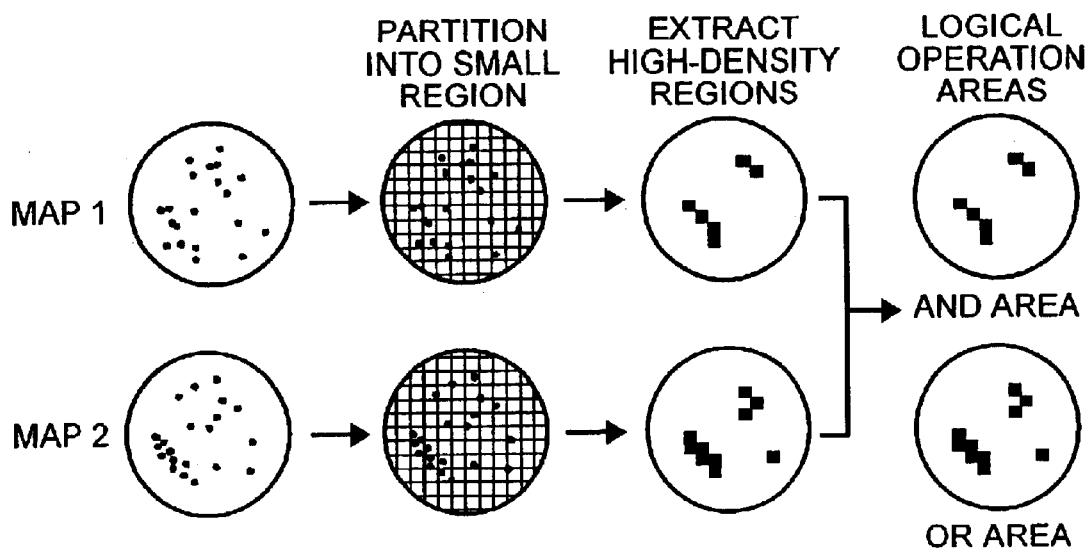

Next, an embodiment of a similarity evaluation of wafer map defect distribution shown in FIG. 28 is explained. First, map 1 and map 2, which are to be compared, are partitioned into small regions. The maps are binarized using a specific, separately determined threshold value in accordance with the density of defects of each small region, and regions of greater than the threshold value are extracted as high-density regions. AND and OR logical operations are carried out for the high-density regions in the respective maps, and each is determined by treating areas subjected to AND operations as AND areas, and areas subjected to OR operations as OR areas. Then, the degree of similarity is defined as Degree of Similarity=AND area/OR area.

The more similar the patterns in map 1 and map 2 are, the smaller the difference between the AND area and the OR area becomes, and the degree of similarity approaches 1. The more dissimilar the patterns of map 1 and map 2 are, the smaller the AND area becomes, and the degree of similarity approaches 0. Subsequent to partitioning the maps into small regions, a density distribution image, which assigns a brightness corresponding to a density to each small region, can be prepared, and normalized cross-correlation functions generally used in image processing can be used as degrees of similarity. Then, n apparatuses and chambers can be extracted in order of similarity from the highest to the lowest; an evaluation value of n can be assigned to the apparatuses and chambers having the highest degree of similarity; and evaluation values can be assigned such that the smaller the degree of similarity is, the smaller the evaluation value becomes, the same as a similarity evaluation of images.

Figure 29:
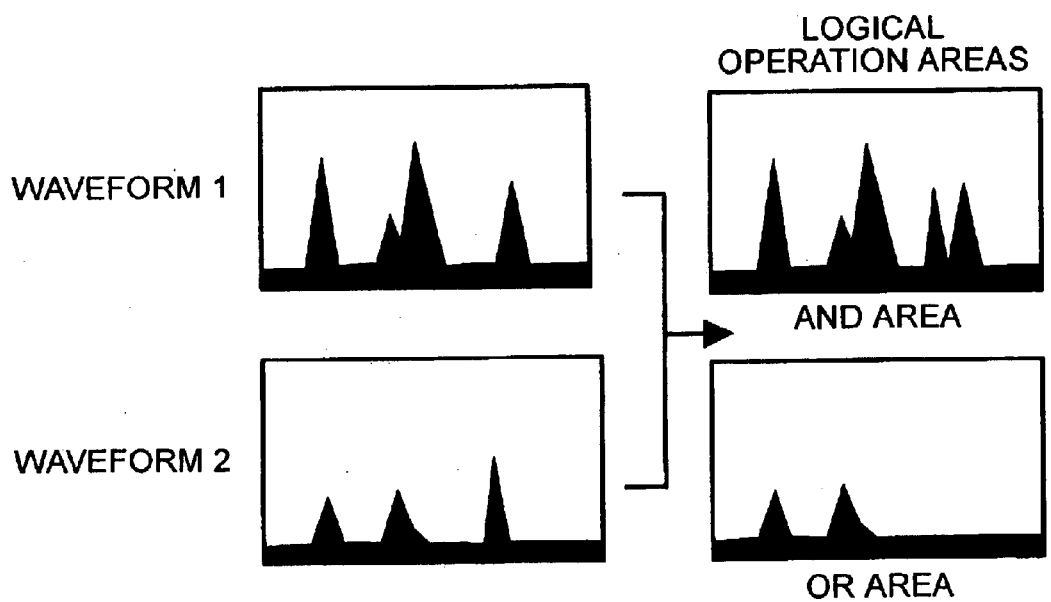

Next, an embodiment of a similarity evaluation for element information, shown in FIG. 29, is explained. With regard to waveform 1 and waveform 2 of the element information spectrums to be compared, AND and OR logical operations are carried out for regions where waveforms overlap. Each is determined by treating areas subjected to AND operations as AND areas, and areas subjected to OR operations as OR areas, and the degree of similarity is determined in the same way as in the map similarity evaluation. Then, in the same manner, n apparatuses and chambers are extracted in order of similarity from the highest to the lowest; an evaluation value of n is assigned to the apparatuses and chambers having the highest degree of similarity; and evaluation values are assigned such that the smaller the degree of similarity, the smaller the evaluation value becomes. Alternatively, a similarity evaluation can be done in accordance with the presence or absence of a typical element comprising defect A and defect B, which are being compared. For example, the evaluation value can be defined as Evaluation Value=(Number of elements in both defect A and defect B)/(Number of elements in either defect A or defect B). This evaluation value has the same trends as image similarities and waveform similarities described up to this point.

Next, an embodiment of a degree of association evaluation between either the detected point density of defects, the ratio of defect classes, or processing log or other such chronological data and the processing time, as shown in FIG. 30 is described. First, an evaluation period in the vicinity of the processing time of a product wafer in which abnormalities occurred is set for each apparatus and chamber. This can be limited to a period prior to the processing time of this wafer, or it can be limited to a period prior or subsequent to but including the processing time of this wafer. A period limitation rule can be carried out by a time specification, for example, within the past few days from the present time, and further, can be a number of wafers specification, such as no more than a certain number of processed wafers, or it can be a lot specification, such as not more than a certain number of the processed lots. At this point, a threshold value that is determined to be the norm is stipulated beforehand. When both positive and negative values are obtained, as in the degree of deviation from the set values of processing logs shown in FIG. 21, threshold values can be set for the respective positive and negative values or a threshold value can be set for an absolute value.

Next, in this period targeted for evaluation of data values, a determination is made about the presence of data values that exceed the threshold value. When there are data values that exceed the threshold value, an evaluation value of 1 is assigned to the apparatus and chambers that exceed the threshold value. Further, as shown in FIG. 30, differential values can be calculated for data value fluctuations, a threshold value can be provided in the same manner for the differential values, and evaluation value operations can be carried out in the same manner.

An embodiment of a method for evaluating the degree of association between apparatus maintenance time and processing time is now described. First, an evaluation period is set in the same manner as explained above for FIG. 30. Then, a determination is made about the maintenance taking place in the period targeted for evaluation. When maintenance has been carried out, an evaluation value of 1, for example, is assigned to the apparatus and chambers on which maintenance was performed.

These calculation methods are not limited to the disclosed methods, and any method will do as long as it is capable of evaluating the degree of association. Nor is it necessary to carry out all of these operations, but rather, they can be implemented for that data for which data acquisition is being implemented. Further, the invention can be set up such that operations are carried out only for items separately specified by a user. In Step 2302 of FIG. 24, for example, determinations regarding the degree of association can be carried out by apparatus or chamber as described below. First, the association evaluation value of each apparatus and chamber is defined as expressed in the following formula:

$$P(i, j, k) = \sum_{x=1}^{z} A_x \cdot P_x(i, j, k) \ldots \text{(No. 1)}$$

Here, i is the process, j is the apparatus number, k is the chamber number, $P_x(i,j,k)$ is the evaluation value for each evaluation item, z is the number of evaluation items, and $A_x$ is the weighting factor of each evaluation item. Thus, by multiplying the evaluation values of each evaluation item by the weighting factor for each apparatus and chamber, adding these products together and determining the size of the association evaluation value, it is possible to extract apparatuses associated with wafers in which abnormalities have occurred.

This calculation method is not limited to the disclosed method, and any method will do as long as it is capable of evaluating the degree of association. The invention can be set up such that the weighting factor can be set arbitrarily by a user, and can be automatically allocated in accordance with a specific rule. As a rule setting method, for example, the respective weights of element information and distribution information can be augmented when the elements, which are used only in certain apparatus are found in defects, or when a defect distribution pattern manifested only in certain apparatuses is detected.

In Step 2303, in accordance with these results, a display can make it clear that certain apparatuses differ from other apparatuses, such as displaying the characteristics of the relevant apparatuses in the display screen shown in FIG. 17 by changing the color of these characteristics. Further, the invention can be set up such that information on extracted apparatuses is communicated to related personnel by an e-mail system not shown in the figure. Further, the invention can be set up such that a plurality of apparatuses and chambers are ranked and displayed in accordance with degree of association.

This embodiment described an example in which an association evaluation engine 17 (shown in FIG. 23) is mounted in data analysis apparatus 107, but as long as this engine can carry out computational processing using the above-explained information, it can exist separately or can be incorporated into another, different apparatus.

According to the invention, since it is possible to easily specify processing apparatuses related to wafers, which have been determined by inspections to be abnormal, and, in addition, it is possible to display the state of defect generation frequency for each processing apparatus around the time period when these wafers were processed, it is easy to infer the apparatus causing the problem. Further, according to the present invention, since data obtained in relation to defects generated in apparatuses, and data obtained from the defects of product wafers constituting abnormalities can be automatically compared and evaluated, and candidates for apparatuses having a high correlation to product wafer defects can be extracted, the number of processes required for specifying apparatuses causing the problem can be greatly reduced.

The invention may be embodied in other specific forms without departing from the spirit or essential characteristics thereof. The present embodiment is, therefore, to be considered in all respects as illustrative and not restrictive, the scope of the invention being indicated by the appended claims rather than by the foregoing description, and all changes that come within the meaning and range of equivalency of the claims are therefore intended to be embraced therein.

What is claimed is:

1. A method for analyzing defect information, comprising:
   extracting defects generated on substrates by comparing data obtained from inspection of the substrates prior to processing the substrate by a prescribed process performed by a plurality of processing apparatuses in a thin-film device manufacturing process and data obtained from inspection of the substrates after processing the substrate by the prescribed process; and
   displaying information on a screen when a number of the extracted defects is greater than a preset number, the information including at least a processing history of the substrates processed by the prescribed process, and states of the processing apparatuses constituting the predetermined process.

2. The method for analyzing defect information according to claim 1, wherein in the step of extracting defects, data obtained by inspecting the substrates either prior to or after processing by the prescribed processes includes at least one of external appearance information of defects on the processed substrates, contained element information of defects, in-device distribution of defects, number of defects, and density of defects.

3. The method for analyzing defect information according to claim 1, wherein in the step of displaying information of the extracted defects are displayed together with information of the processing histories of the processed substrates, and the states of the processing apparatus.

4. The method for analyzing defect information according to claim 1, wherein in the step of displaying information, the information of the processing histories of the substrates is information to identify a processing apparatus, which processed the substrates from other apparatuses in the plurality of processing apparatuses constituting the prescribed processes.

5. The method for analyzing defect information according to claim 1, wherein in the step of displaying information, the states of the processing apparatus is data related to logs of processing conditions of a plurality of processing apparatuses, which processed the substrates in the prescribed processes, and to defects generated on the substrates by processing the substrates by one of the plurality of processing apparatuses.

6. The method for analyzing defect information according to claim 1, wherein in the step of displaying information, the states of the processing apparatus comprises one of either information of chronological transitions of the processing conditions logs of the plurality of processing apparatuses, or chronological transition information of defects generated on the substrates processed by one of the plurality of processing apparatuses.

7. The method for analyzing defect information according to claim 1, wherein in the step of displaying information, a substrate type, a lot number of corresponding to a number of the processing unit, the number of the processed substrates, and a contents of the processes are displayed on a screen.

8. A method for analyzing defect information, comprising the steps of:
   extracting defects on the processed substrates resulting from carrying out processing in prescribed processing processes constituted by a plurality of processing apparatuses in a thin-film device manufacturing process;
   obtaining detailed images of the extracted defects by photographing the extracted defects when the number of these extracted defects is larger than a preset number;
   classifying the detailed images of the extracted defects; and
   displaying the detailed images of these classified defects and information on the distribution of the extracted defects on the processed substrates on a screen together with information showing the processing histories of the processed substrates in the plurality of processing apparatuses and information related to the states of the processing apparatuses, which processed the processed substrates in the prescribed processing processes.

9. The method for analyzing defect information according to claim 8, wherein, when the number of the extracted defects is larger than a preset number, detailed images of the extracted defects are acquired, and these acquired detailed images of defects are displayed on the screen together with information showing the processing histories of the processed substrates and information related to the states of the processing apparatus.

10. The method for analyzing defect information according to claim 8, wherein the information showing the processing histories of the processed substrates is information displayed such that the processing apparatus, which actually processed the processed substrates can be identified from the other apparatuses in the plurality of processing apparatuses constituting the prescribed processing processes.

11. The method for analyzing defect information according to claim 8, wherein information related to the states of the processing apparatus is data related to logs of processing conditions of a plurality of processing apparatuses, which processed the processed substrates in the prescribed processing processes, and to defects generated on the processed substrates for each of these plurality of processing apparatuses, when the processed substrates were processed by this plurality of processing apparatuses.

12. The method for analyzing defect information according to claim 8, wherein information related to the states of the processing apparatus comprises one of either information of chronological transitions of the processing conditions logs of the plurality of processing apparatuses, or chronological transition information of defects generated on the processed substrates in each of the plurality of processing apparatuses.

13. The method for analyzing defect information according to claim 8, wherein the display screen further displays the type of the processed substrates, the number of the lot, which is the processing unit, the numbers of the processed substrates, and the scope of the processing processes.

14. A method for analyzing defect information, comprising:

extracting defects on the processed substrates resulting from processing in prescribed processing processes constituted by a plurality of processing apparatuses in a thin-film device manufacturing process;

classifying detailed images of these extracted defects by photographing these extracted defects when the number of these extracted defects is larger than a preset number, and obtaining information on the distribution of each of these classified defects on the processed substrates; and displaying on a screen distribution information of each of these classified defects on the processed substrates, information showing the processing histories of the processed substrates in the plurality of processing apparatuses constituting the prescribed processing processes, and information related to the states of the processing apparatuses, which processed the processed substrates in the prescribed processing processes.

15. The method for analyzing defect information according to claim 14, wherein the detailed images of the defects displayed on the screen are classified according to each category of defect.

16. The method for analyzing defect information according to claim 14, wherein, when the number of the extracted defects is larger than a preset number, detailed images of the extracted defects are acquired, and these acquired detailed images of defects are displayed on the screen together with information showing the processing histories of the processed substrates and information related to the states of the processing apparatus.

17. The method for analyzing defect information according to claim 14, wherein the information showing the processing histories of the processed substrates is information displayed such that the processing apparatus, which actually processed the processed substrates can be identified from the other apparatuses in the plurality of processing apparatuses constituting the prescribed processing processes.

18. The method for analyzing defect information according to claim 14, wherein information related to the states of the processing apparatus is data related to logs of processing conditions of a plurality of processing apparatuses, which processed the processed substrates in the prescribed processing processes, and to defects generated on the processed substrates for each of these plurality of processing apparatuses, when the processed substrates were processed by this plurality of processing apparatuses.

19. The method for analyzing defect information according to claim 14, wherein information related to the states of the processing apparatus comprises one of either information of chronological transitions of the processing conditions logs of the plurality of processing apparatuses, or chronological transition information of defects generated on the processed substrates in each of the plurality of processing apparatuses.

20. The method for analyzing defect information according to claim 14, wherein the display screen further displays the type of the processed substrates, the number of the lot, which is the processing unit, the numbers of the processed substrates, and the scope of the processing processes.

21. A method for analyzing defect information, comprising:

extracting defects generated on the processed substrates resulting from carrying out processing in prescribed processing processes constituted by a plurality of processing apparatuses in a thin-film device manufacturing process;

determining the presence of abnormality of defect generation using information of one of the number or density of these extracted defects;

obtaining detailed images of these extracted defects by photographing these extracted defects when abnormality of defect generation is detected;

classifying these images, and obtaining information on the distribution of each of these classified defects on the processed substrates;

evaluating the association with the defect generation abnormalities of the plurality of processing apparatuses on the basis of distribution information of each of these classified defects on the processed substrates, information on the processing histories of the processed substrates in the plurality of processing apparatuses constituting the prescribed processing processes, and information related to the states of the processing apparatuses, which processed the processed substrates in the prescribed processing processes; and displaying on a screen information related to processing apparatus of the plurality of processing apparatuses, which have high correlation with the defect generation abnormality.

22. The method for analyzing defect information according to claim 21, wherein the information showing the processing histories of the processed substrates is information displayed such that the processing apparatus, which actually processed the processed substrates can be identified from the other apparatuses in the plurality of processing apparatuses constituting the prescribed processing processes.

23. The method for analyzing defect information according to claim 21, wherein information related to the states of the processing apparatus is data related to logs of processing conditions of a plurality of processing apparatuses, which processed the processed substrates in the prescribed processing processes, and to defects generated on the processed substrates for each of these plurality of processing apparatuses, when the processed substrates were processed by this plurality of processing apparatuses.

24. The method for analyzing defect information according to claim 21, wherein information related to the states of the processing apparatus comprises one of either information of chronological transitions of the processing conditions logs of the plurality of processing apparatuses, or chronological transition information of defects generated on the processed substrates in each of the plurality of processing apparatuses.

25. The method for analyzing defect information according to claim 21, wherein the display screen further displays the type of the processed substrates, the number of the lot, which is the processing unit, the numbers of the processed substrates, and the scope of the processing processes.

26. An apparatus for analyzing defect information comprising:

a defect extractor for extracting defects generated on processed substrates resulting from performing processing in prescribed processing processes, by comparing data obtained by inspecting the processed substrates prior to performing processing in the prescribed processing processes constituted by a plurality of processing apparatuses in a thin-film device manufacturing process, and data obtained by inspecting the processed substrates subsequent to performing the prescribed processing processes; and a defect processor for processing and displaying on a screen information describing the processing history of the processed substrates in a plurality of processing apparatuses constituting the prescribed processing processes, and information related to the states of the processing apparatuses, which processed the processed substrates in the prescribed processing processes when the number of defects extracted by this defect extracting means is compared against a preset number, and the number of the extracted defects is larger than the preset number.

27. The apparatus for analyzing defect information according to claim 26, wherein the defect extractor extracts defects generated on the processed substrates using at the least one or more of data related to external appearance information of defects on the processed substrates, entrained element information of defects, in-device distribution of defects, number of defects, and density of defects, obtained by inspecting the processed substrates either prior to performing processing in the prescribed processing processes, or subsequent to performing processing in the prescribed processing processes.

28. An apparatus for analyzing defect information comprising:

defect extracting apparatus that extracts defects generated on processed substrates resulting from carrying out processing in prescribed processing processes constituted by a plurality of processing apparatuses in a thin-film device manufacturing process;

abnormality determining apparatus for determining the presence of abnormality of defect generation using information of either the number or density of defects extracted by this defect extracting means;

evaluation apparatus for evaluating association with the defect generation abnormality of the plurality of processing apparatuses on the basis of distribution information obtained by classifying detailed images of the extracted defects, information on the processing histories of the processed substrates in the plurality of processing apparatuses constituting the prescribed processing processes, and information related to the states of the processing apparatuses, which processed the processed substrates in the prescribed processing processes, when defect generation abnormality is determined by this abnormality determining apparatus; and a display for displaying on a screen information related to processing apparatus of the plurality of processing apparatuses evaluated by this evaluating means, which have high correlation with the defect generation abnormality.

* * * * *